United States Patent [19]

Tarui et al.

[11] Patent Number: 5,674,563
[45] Date of Patent: Oct. 7, 1997

[54] METHOD FOR FERROELECTRIC THIN FILM PRODUCTION

[75] Inventors: Yasuo Tarui, No. 6-4, Minamisawa 5-chome, Higashikurume City, Tokyo; Yoshihiro Soutome, Osaka; Shinichi Morita, Yokosuka; Satoshi Tanimoto, Tokyo, all of Japan

[73] Assignees: Nissan Motor Co., Ltd., Yokohama; Sharp Kabushiki Kaisha, Osaka; Yasuo Tarui, Tokyo, all of Japan

[21] Appl. No.: 305,536

[22] Filed: Sep. 14, 1994

[30] Foreign Application Priority Data

Sep. 14, 1993 [JP] Japan .................... 5-228541

[51] Int. Cl.$^6$ .................................. C23C 16/00
[52] U.S. Cl. .............. 427/250; 427/255.1; 427/255.2; 427/255.3; 427/376.2
[58] Field of Search ................ 427/25 P, 255.1, 427/255.2, 255.3, 376.2

[56] References Cited

U.S. PATENT DOCUMENTS

| | | | |
|---|---|---|---|
| 5,104,690 | 4/1992 | Greenwald | 427/126.3 |
| 5,198,269 | 3/1993 | Swartz et al. | 427/226 |
| 5,258,204 | 11/1993 | Wernberg et al. | 427/255 |
| 5,372,859 | 12/1994 | Thakoor | 427/551 |
| 5,478,610 | 12/1995 | Desu et al. | 427/573 |

OTHER PUBLICATIONS

Pp. 115–117 of "Ferroelectric Thin Film Integration Techniques", published Feb. 2, 1992 by Science Forum, Japan.

*Primary Examiner*—Benjamin Utech
*Attorney, Agent, or Firm*—Lowe, Price, LeBlanc & Becker

[57] ABSTRACT

A ferroelectric thin film is produced on a substrate placed in an oxygen gas atmosphere within a reaction chamber. Evaporated source materials (organic metal compounds) are separately introduced in a predetermined sequence into the reaction chamber to produce a PZT or PLZT layer structure having an estimated stoichiometric composition. This cycle of introduction of the source materials is repeated continuously to produce a PZT or PLZT ferroelectric thin film having a predetermined number of PZT or PLZT layer structures piled on the substrate.

213 Claims, 8 Drawing Sheets

METHOD FOR FERROELECTRIC THIN FILM PRODUCTION

BACKGROUND OF THE INVENTION

This invention relates to a method of producing a ferroelectric thin film used for capacitors, memory devices, sensors and other electronic devices.

Ferroelectric substances, such as PZT ($Pb(Zr_xTi_{1-x})O_3$), PLZT ($Pb_{1-y}La_y)(Zr_xTi_{1-x})_{1-y/4}O_3$) and the like, exhibit excellent ferroelectric, piezoelectric and pyroelectric properties and high dielectric constants suitable for use in various electronic devices. Several techniques have been used to produce ferroelectric thin films. In an article published on Feb. 2, 1992, and entitled "Ferroelectric Thin Film Integration Techniques", there is described a metal-organic chemical vapor deposition (MOCVD) apparatus as shown in FIG. 13. The MOCVD apparatus includes a reaction chamber A which contains a susceptor B therein. The susceptor B has a substrate C supported thereon. The reaction chamber A is connected to an exhaust line D having a pressure ajduster E, an exhaust pump F and an exhaust purifier G. The reaction chamber A is also connected to a leakage line H.

The MOCVD apparatus also includes sources of oxygen and nitrogen gases. The oxygen gas source ($O_2$) is connected to the reaction chamber A through an oxygen gas line I having a gas flow controller J1 placed therein for controlling the rate of oxygen gas flow through the oxygen gas line I. The nitrogen gas source ($N_2$) is connected through a gas flow controller J2 to a first evaporator K1, through a gas flow controller J3 to a second evaporator K2, through a gas flow controller J4 to a third evaporator K3 and through a gas flow controller J5 to a fourth evaporator K4. Each of the gas flow controllers J2, J3, J4 and J5 operates to control the rate of flow of the nitrogen carrier gas to the corresponding one of the evaporators K1, K2, K3 and K4. The first evaporator contains a Pb source material (for example, $Pb(C_2H_5)_4$) which is evaporated therein and fed through a line L1 to the reaction chamber A. The second evaporator K2 contains a La source material (for example, $La(DPM)_3$) which is evaporated therein and fed through a line L2 to the reaction chamber A. The third evaporator K3 contains a Ti source material (for example, $Ti(i-OC_3H_7)_4$) which is evaporated therein and fed through a line L3 to the reaction chamber A. The fourth evaporator K4 contains a Zr source material (for example, $Zr(DPM)_4$) which is evaporated therein and fed through a line L4 to the reaction chamber A.

A PZT thin film is piled on the substrate C by operating the gas flow controller J1, J2, J4 and J5 to introduce the $N_2$ carrier gas into the first, third and fourth evaporators K1, K3 and K4 so as to introduce evaporated Pb, Ti and Zr source materials into the reaction chamber A in an atmosphere of $O_2$. Similarly, a PLZT thin film is piled on the substrate C by operating the gas flow controllers J1, J2, J3, J4 and J5 to introduce the $N_2$ carrier gas into the respective evaporators K1, K2, K3 and K4 so as to introduce evaporated Pb, La, Ti and Zr source materials into the reaction chamber A in an atmosphere of $O_2$.

With the MOCVD apparatus, however, the source materials are introduced continuously and simultaneously into the reaction chamber A. Thus, the source materials are mixed with each other before and after they are introduced into the reaction chamber A and also before and after they are deposited on the substrate C. In other words, the source materials react partially in the material feed line extending into the reaction chamber A, partially in the reaction chamber A and partially on the substrate C. Such complex reactions cause the produced thin film to have random molecular bond and orientation or locally unbalanced composition even though an estimated stoichiometric composition is obtained over the entire area of the produced thin film. Therefore, it is very difficult, if not impossible, to produce a uniform epitaxial film having a perovskite structure.

SUMMARY OF THE INVENTION

A main object of the invention is to provide an improved ferroelectric thin film producing method which permits stable production of high-quality PZT or PLZT ferroelectric thin film.

It is another object of the invention to provide an improved ferroelectric thin film producing method which can produce ferroelectric thin films having a higher degree of flatness.

There is provided, in accordance with the invention, a method of producing a ferroelectric thin film on a substrate placed on a susceptor in a reaction chamber. The ferroelectric thin film producing method comprises the steps of: (a) introducing $O_2$ and/or $O_3$ gases into the reaction chamber to provide an oxygen gas atmosphere therein; (b) producing a PZT layer structure having a stoichiometric composition given as $Pb(Zr_xTi_{1-x})O_3$ where $0<x<1$ by introducing evaporated Ti source material into the reaction chamber to produce a first layer which is one of Ti and $TiO_2$ layers having a predetermined thickness, then introducing evaporated Pb source material into the reaction chamber to produce a second layer which is one of Pb and PbO layers having a predetermined thickness, then introducing evaporated Zr source material into the reaction chamber to produce a third layer which is one of Zr and $ZrO_2$ layers having a predetermined thickness, and thereafter introducing evaporated Pb source material into the reaction chamber to produce a fourth layer which is one of Pb and PbO layers having a predetermined thickness so as to produce a layer structure having first, second, third and fourth layers piled in this order, then this structure being transformed into a PZT layer structure by thermal energy of the heated substrate; and (c) continuously repeating the sequence of the step (b) a predetermined number of times to produce the PZT ferroelectric thin film having a predetermined number of PZT layer structures on the substrate.

In another aspect of the invention, the ferroelectric thin film producing method comprises the steps of: (a) introducing $O_2$ and/or $O_3$ gases into the reaction chamber to provide an oxygen gas atmosphere therein; (b) producing a PZT layer structure having a stoichiometric composition given as $Pb(Zr_xTi_{1-x})O_3$ where $0<x<1$ by introducing evaporated Ti source material into the reaction chamber to produce a first layer which is one of Ti and $TiO_2$ layers having a predetermined thickness, then introducing evaporated Zr source material into the reaction chamber to produce a second layer which is one of Zr and $ZrO_2$ layers having a predetermined thickness, and thereafter introducing evaporated Pb source material into the reaction chamber to produce a third layer which is one of Pb and PbO layers having a predetermined thickness so as to produce a PZT layer structure having first, second and third layers piled in this order; and (c) repeating the sequence of the step (b) a predetermined number of times to produce the PZT ferroelectric thin film having a predetermined number of PZT layer structures piled on the substrate.

In another aspect of the invention, the ferroelectric thin film producing method comprises the steps of: (a) introducing $O_2$ and/or $O_3$ gases into the reaction chamber to provide an oxygen gas atmosphere therein; (b) producing a PZT layer structure having a stoichiometric composition given as $Pb(Zr_xTi_{1-x})O_3$ where $0<x<1$ by introducing evaporated Zr source material into the reaction chamber to produce a first layer which is one of Zr and $ZrO_2$ layers having a predetermined thickness, then introducing evaporated Ti source material into the reaction chamber to produce a second layer which is one of Ti and $TiO_2$ layers having a predetermined thickness, and thereafter introducing evaporated Pb source material into the reaction chamber to produce a third layer which is one of Pb and PbO layers having a predetermined thickness so as to produce a PZT layer structure having first, second and third layers piled in this order; and (c) repeating the sequence of the step (b) a predetermined number of times to produce the PZT ferroelectric thin film having a predetermined number of PZT layer structures piled on the substrate.

In another aspect of the invention, the ferroelectric thin film producing method comprises the steps of: (a) introducing $O_2$ and/or $O_3$ gases into the reaction chamber to provide an oxygen gas atmosphere therein; (b) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Ti source material into the reaction chamber to produce a first layer which is one of Ti and $TiO_2$ layers having a predetermined thickness, then introducing evaporated Pb source material into the reaction chamber to produce a second layer which is one of Pb and PbO layers having a predetermined thickness, then introducing evaporated La source material into the reaction chamber to produce a third layer which is one of La and $La_2O_3$ layers having a predetermined thickness, then introducing evaporated Zr source material into the reaction chamber to produce a fourth layer which is one of Zr and $ZrO_2$ layers having a predetermined thickness, then introducing evaporated Pb source material into the reaction chamber to produce a fifth layer which is one of Pb and PbO layers having a predetermined thickness, and thereafter introducing evaporated La source material into the reaction chamber to produce a sixth layer which is one of La and $La_2O_3$ layers having a predetermined thickness so as to produce a PLZT layer structure having first, second, third, fourth, fifth and sixth layers piled in this order; and (c) repeating the sequence of the step (b) a predetermined number of times to produce the PLZT ferroelectric thin film having a predetermined number of PLZT layer structures piled on the substrate.

In another aspect of the invention, the ferroelectric thin film producing method comprises the steps of: (a) introducing $O_2$ and/or $O_3$ gases into the reaction chamber to provide an oxygen gas atmosphere therein; (b) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Ti source material into the reaction chamber to produce a first layer which is one of Ti and $TiO_2$ layers having a predetermined thickness, then introducing evaporated La source material into the reaction chamber to produce a second layer which is one of La and $La_2O_3$ layers having a predetermined thickness, then introducing evaporated Pb source material into the reaction chamber to produce a third layer which is one of Pb and PbO layers having a predetermined thickness, then introducing evaporated Zr source material into the reaction chamber to produce a fourth layer which is one of Zr and $ZrO_2$ layers having a predetermined thickness, then introducing evaporated La source material into the reaction chamber to produce a fifth layer which is one of La and $La_2O_3$ layers having a predetermined thickness, and thereafter introducing evaporated Pb source material into the reaction chamber to produce a sixth layer which is one of Pb and PbO layers having a predetermined thickness so as to produce a PLZT layer structure having first, second, third, fourth, fifth and sixth layers piled in this order; and (c) repeating the sequence of the step (b) a predetermined number of times to produce the PLZT ferroelectric thin film having a predetermined number of PLZT layer structures piled on the substrate.

In another aspect of the invention, the ferroelectric thin film producing method comprises the steps of: (a) introducing $O_2$ and/or $O_3$ gases into the reaction chamber to provide an oxygen gas atmosphere therein; (b) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Ti source material into the reaction chamber to produce a first layer which is one of Ti and $TiO_2$ layers having a predetermined thickness, then introducing evaporated Zr source material into the reaction chamber to produce a second layer which is one of Zr and $ZrO_2$ layers having a predetermined thickness, then introducing evaporated Pb source material into the reaction chamber to produce a third layer which is one of Pb and PbO layers having a predetermined thickness, and thereafter introducing evaporated La source material into the reaction chamber to produce a fourth layer which is one of La and $La_2O_3$ layers having a predetermined thickness so as to produce a PLZT layer structure having first, second, third and fourth layers piled in this order; and (c) repeating the sequence of the step (b) a predetermined number of times to produce the PLZT ferroelectric thin film having a predetermined number of PLZT layer structures piled on the substrate.

In another aspect of the invention, the ferroelectric thin film producing method comprises the steps of: (a) introducing $O_2$ and/or $O_3$ gases into the reaction chamber to provide an oxygen gas atmosphere therein; (b) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Ti source material into the reaction chamber to produce a first layer which is one of Ti and $TiO_2$ layers having a predetermined thickness, then introducing evaporated Zr source material into the reaction chamber to produce a second layer which is one of Zr and $ZrO_2$ layers having a predetermined thickness, then introducing evaporated La source material into the reaction chamber to produce a third layer which is one of La and $La_2O_3$ layers having a predetermined thickness, and thereafter introducing evaporated Pb source material into the reaction chamber to produce a fourth layer which is one of Pb and PbO layers having a predetermined thickness so as to produce a PLZT layer structure having first, second, third and fourth layers piled in this order; and (c) repeating the sequence of the step (b) a predetermined number of times to produce the PLZT ferroelectric thin film having a predetermined number of PLZT layer structures piled on the substrate.

In another aspect of the invention, the ferroelectric thin film producing method comprises the steps of: (a) introducing $O_2$ and/or $O_3$ gases into the reaction chamber to provide an oxygen gas atmosphere therein; (b) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Zr source material into the reaction chamber to produce a first layer which is one of Zr and $ZrO_2$ layers having a predetermined thickness, then introducing evaporated Ti source material into the reaction chamber to produce a second layer which is one of Ti and $TiO_2$ layers having a predetermined thickness, then introducing evaporated Pb source material into the reaction chamber to produce a third layer which is one of Pb and PbO layers having a predetermined thickness, and thereafter introducing evaporated La source material into the reaction chamber to produce a fourth layer which is one of La and $La_2O_3$ layers having a predetermined thickness so as to produce a PLZT layer structure having first, second, third and fourth layers piled in this order; and (c) repeating the sequence of the step (b) a predetermined number of times to produce the PLZT ferroelectric thin film having a predetermined number of PLZT layer structures piled on the substrate.

In another aspect of the invention, the ferroelectric thin film producing method comprises the steps of: (a) introducing $O_2$ and/or $O_3$ gases into the reaction chamber to provide an oxygen gas atmosphere therein; (b) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Zr source material into the reaction chamber to produce a first layer which is one of Zr and $ZrO_2$ layers having a predetermined thickness, then introducing evaporated Ti source material into the reaction chamber to produce a second layer which is one of Ti and $TiO_2$ layers having a predetermined thickness, then introducing evaporated La source material into the reaction chamber to produce a third layer which is one of La and $La_2O_3$ layers having a predetermined thickness, and thereafter introducing evaporated Pb source material into the reaction chamber to produce a fourth layer which is one of Pb and PbO layers having a predetermined thickness so as to produce a PLZT layer structure having first, second, third and fourth layers piled in this order; and (c) repeating the sequence of the step (b) a predetermined number of times to produce the PLZT ferroelectric thin film having a predetermined number of PLZT layer structures piled on the substrate.

In another aspect of the invention, the ferroelectric thin film producing method comprises the steps of: (a) introducing $O_2$ and/or $O_3$ gases into the reaction chamber to provide an oxygen gas atmosphere therein; (b) producing a $PbTiO_3$ layer structure by introducing evaporated Ti source material into the reaction chamber to produce a first layer and then introducing evaporated Pb source material into the reaction chamber to produce a second layer so as to produce a $PbTiO_3$ layer structure having the first and second layers piled in this order; (c) repeating the sequence of the step (b) a predetermined number of times to produce a $PbTiO_3$ film having a predetermined number of $PbTiO_3$ layer structures piled on the substrate; (d) producing a PZT layer structure having a stoichiometric composition given as $Pb(Zr_xTi_{1-x})O_3$ where $0<x<1$ by introducing evaporated Ti source material into the reaction chamber to produce a first layer which is one of Ti and $TiO_2$ layers having a predetermined thickness, then introducing evaporated Pb source material into the reaction chamber to produce a second layer which is one of Pb and PbO layers having a predetermined thickness, then introducing evaporated Zr source material into the reaction chamber to produce a third layer which is one of Zr and $ZrO_2$ layers having a predetermined thickness, and thereafter introducing evaporated Pb source material into the reaction chamber to produce a fourth layer which is one of Pb and PbO layers having a predetermined thickness so as to produce a PZT layer structure having first, second, third and fourth layers piled in this order; and (e) repeating the sequence of the step (d) a predetermined number of times to produce the PZT ferroelectric thin film having a predetermined number of PZT layer structures piled on the $PbTiO_3$ film.

In another aspect of the invention, the ferroelectric thin film producing method comprises the steps of: (a) introducing $O_2$ and/or $O_3$ gases into the reaction chamber to provide an oxygen gas atmosphere therein; (b) producing a $PbTiO_3$ layer structure by introducing evaporated Ti source material into the reaction chamber to produce a first layer and then introducing evaporated Pb source material into the reaction chamber to produce a second layer so as to produce a $PbTiO_3$ layer structure having the first and second layers piled in this order; (c) repeating the sequence of the step (b) a predetermined number of times to produce a $PbTiO_3$ film having a predetermined number of $PbTiO_2$ layer structures piled on the substrate; (d) producing a PZT layer structure having a stoichiometric composition given as $Pb(Zr_xTi_{1-x})O_3$ where $0<x<1$ by introducing evaporated Zr source material into the reaction chamber to produce a first layer which is one of Zr and $ZrO_2$ layers having a predetermined thickness, then introducing evaporated Ti source material into the reaction chamber to produce a second layer which is one of Ti and $TiO_2$ layers having a predetermined thickness, and thereafter introducing evaporated Pb source material into the reaction chamber to produce a third layer which is one of Pb and PbO layers having a predetermined thickness so as to produce a PZT layer structure having first, second and third layers piled in this order; and (e) repeating the sequence of the step (b) a predetermined number of times to produce the PZT ferroelectric thin film having a predetermined number of PZT layer structures piled on the $PbTiO_3$ film.

In another aspect of the invention, the ferroelectric thin film producing method comprises the steps of: (a) introducing $O_2$ and/or $O_3$ gases into the reaction chamber to provide an oxygen gas atmosphere therein; (b) producing a $PbTiO_3$ layer structure by introducing evaporated Ti source material into the reaction chamber to produce a first layer and then introducing evaporated Pb source material into the reaction chamber to produce a second layer so as to produce a $PbTiO_3$ layer structure having the first and second layers piled in this order; (c) repeating the sequence of the step (b) a predetermined number of times to produce a $PbTiO_3$ film having a predetermined number of PbTiO$_3$ layer structures piled on the substrate; (d) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Ti source material into the reaction chamber to produce a third layer which is one of Ti and TiO$_2$ layers having a predetermined thickness, then introducing evaporated Pb source material into the reaction chamber to produce a fourth layer which is one of Pb and PbO layers having a predetermined thickness, then introducing evaporated La source material into the reaction chamber to produce a fifth layer which is one of La and La$_2$O$_3$ layers having a predetermined thickness, then introducing evaporated Zr source material into the reaction chamber to produce a sixth layer which is one of Zr and ZrO$_2$ layers having a predetermined thickness, then introducing evaporated Pb source material into the reaction chamber to produce a seventh layer which is one of Pb and PbO layers having a predetermined thickness, and thereafter introducing evaporated La source material into the reaction chamber to produce an eighth layer which is one of La and La$_2$O$_3$ layers having a predetermined thickness so as to produce a PLZT layer structure having third, fourth, fifth, sixth, seventh and eighth layers piled in this order; and (e) repeating the sequence of the step (d) a predetermined number of times to produce the PLZT ferroelectric thin film having a predetermined number of PLZT layer structures piled on the PbTiO$_3$ film.

In another aspect of the invention, the ferroelectric thin film producing method comprises the steps of: (a) introducing O$_2$ and/or O$_3$ gases into the reaction chamber to provide an oxygen gas atmosphere therein; (b) producing a PbTiO$_3$ layer structure by introducing evaporated Ti source material into the reaction chamber to produce a first layer and then introducing evaporated Pb source material into the reaction chamber to produce a second layer so as to produce a PbTiO$_3$ layer structure having the first and second layers piled in this order; (c) repeating the sequence of the step (b) a predetermined number of times to produce a PbTiO$_3$ film having a predetermined number of PbTiO$_3$ layer structures piled on the substrate; (d) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Ti source material into the reaction chamber to produce a third layer which is one of Ti and TiO$_2$ layers having a predetermined thickness, then introducing evaporated La source material into the reaction chamber to produce a fourth layer which is one of La and La$_2$O$_3$ layers having a predetermined thickness, then introducing evaporated Pb source material into the reaction chamber to produce a fifth layer which is one of Pb and PbO layers having a predetermined thickness, then introducing evaporated Zr source material into the reaction chamber to produce a sixth layer which is one of Zr and ZrO$_2$ layers having a predetermined thickness, then introducing evaporated La source material into the reaction chamber to produce a seventh layer which is one of La and La$_2$O$_3$ layers having a predetermined thickness, and thereafter introducing evaporated Pb source material into the reaction chamber to produce an eighth layer which is one of Pb and PbO layers having a predetermined thickness so as to produce a PLZT layer structure having third, fourth, fifth, sixth, seventh and eighth layers piled in this order; and (e) repeating the sequence of the step (d) a predetermined number of times to produce the PLZT ferroelectric thin film having a predetermined number of PLZT layer structures piled on the PbTiO$_3$ film.

In another aspect of the invention, the ferroelectric thin film producing method comprises the steps of: (a) introducing O$_2$ and/or O$_3$ gases into the reaction chamber to provide an oxygen gas atmosphere therein; (b) producing a PbTiO$_3$ layer structure by introducing evaporated Ti source material into the reaction chamber to produce a first layer and then introducing evaporated Pb source material into the reaction chamber to produce a second layer so as to produce a PbTiO$_3$ layer structure having the first and second layers piled in this order; (c) repeating the sequence of the step (b) a predetermined number of times to produce a PbTiO$_3$ film having a predetermined number of PbTiO$_3$ layer structures piled on the substrate; (d) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Ti source material into the reaction chamber to produce a third layer which is one of Ti and TiO$_2$ layers having a predetermined thickness, then introducing evaporated Zr source material into the reaction chamber to produce a fourth layer which is one of Zr and ZrO$_2$ layers having a predetermined thickness, then introducing evaporated Pb source material into the reaction chamber to produce a fifth layer which is one of Pb and PbO layers having a predetermined thickness, and thereafter introducing evaporated La source material into the reaction chamber to produce a sixth layer which is one of La and La$_2$O$_3$ layers having a predetermined thickness so as to produce a PLZT layer structure having third, fourth, fifth and sixth layers piled in this order; and (e) repeating the sequence of the step (d) a predetermined number of times to produce the PLZT ferroelectric thin film having a predetermined number of PLZT layer structures piled on the PbTiO$_3$ film.

In another aspect of the invention, the ferroelectric thin film producing method comprises the steps of: (a) introducing O$_2$ and/or O$_3$ gases into the reaction chamber to provide an oxygen gas atmosphere therein; (b) producing a PbTiO$_3$ layer structure by introducing evaporated Ti source material into the reaction chamber to produce a first layer and then introducing evaporated Pb source material into the reaction chamber to produce a second layer so as to produce a PbTiO$_3$ layer structure having the first and second layers piled in this order; (c) repeating the sequence of the step (b) a predetermined number of times to produce a PbTiO$_3$ film having a predetermined number of PbTiO$_3$ layer structures piled on the substrate; (d) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Ti source material into the reaction chamber to produce a third layer which is one of Ti and TiO$_2$ layers having a predetermined thickness, then introducing evaporated Zr source material into the reaction chamber to produce a fourth layer which is one of Zr and ZrO$_2$ layers having a predetermined thickness, then introducing evaporated La source material into the reaction chamber to produce a fifth layer which is one of La and La$_2$O$_3$ layers having a predetermined thickness, and thereafter introducing evaporated Pb source material into the reaction chamber to produce a sixth layer which is one of Pb and PbO layers having a predetermined thickness so as to produce a PLZT layer structure having third, fourth, fifth and sixth layers piled in this order; and (e) repeating the sequence of the step (d) a predetermined number of times to produce the PLZT ferroelectric thin film having a predetermined number of PLZT layer structures piled on the PbTiO$_3$ film.

In another aspect of the invention, the ferroelectric thin film producing method comprises the steps of: (a) introducing O$_2$ and/or O$_3$ gases into the reaction chamber to provide an oxygen gas atmosphere therein; (b) producing a PbTiO$_3$ layer structure by introducing evaporated Ti source material into the reaction chamber to produce a first layer and then introducing evaporated Pb source material into the reaction chamber to produce a second layer so as to produce a PbTiO$_3$ layer structure having the first and second layers piled in this order; (c) repeating the sequence of the step (b) a predetermined number of times to produce a PbTiO$_3$ film having a predetermined number of PbTiO$_3$ layer structures piled on the substrate; (d) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Zr source material into the reaction chamber to produce a third layer which is one of Zr and ZrO$_2$ layers having a predetermined thickness, then introducing evaporated Ti source material into the reaction chamber to produce a fourth layer which is one of Ti and TiO$_2$ layers having a predetermined thickness, then introducing evaporated Pb source material into the reaction chamber to produce a fifth layer which is one of Pb and PbO layers having a predetermined thickness, and thereafter introducing evaporated La source material into the reaction chamber to produce a sixth layer which is one of La and La$_2$O$_3$ layers having a predetermined thickness so as to produce a PLZT layer structure having third, fourth, fifth and sixth layers piled in this order; and (e) repeating the sequence of the step (d) a predetermined number of times to produce the PLZT ferroelectric thin film having a predetermined number of PLZT layer structures piled on the PbTiO$_3$ film.

In another aspect of the invention, the ferroelectric thin film producing method comprises the steps of: (a) introducing O$_2$ and/or O$_3$ gases into the reaction chamber to provide an oxygen gas atmosphere therein; (b) producing a PbTiO$_3$ layer structure by introducing evaporated Ti source material into the reaction chamber to produce a first layer and then introducing evaporated Pb source material into the reaction chamber to produce a second layer so as to produce a PbTiO$_3$ layer structure having the first and second layers piled in this order; (c) repeating the sequence of the step (b) a predetermined number of times to produce a PbTiO$_3$ film having a predetermined number of PbTiO$_3$ layer structures piled on the substrate; (d) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<x<1 by introducing evaporated Zr source material into the reaction chamber to produce a third layer which is one of Zr and ZrO$_2$ layers having a predetermined thickness, then introducing evaporated Ti source material into the reaction chamber to produce a fourth layer which is one of Ti and TiO$_2$ layers having a predetermined thickness, then introducing evaporated La source material into the reaction chamber to produce a fifth layer which is one of La and La$_2$O$_3$ layers having a predetermined thickness, and thereafter introducing evaporated Pb source material into the reaction chamber to produce a sixth layer which is one of Pb and PbO layers having a predetermined thickness so as to produce a PLZT layer structure having third, fourth, fifth and sixth layers piled in this order; and (e) repeating the sequence of the step (d) a predetermined number of times to produce the PLZT ferroelectric thin film having a predetermined number of PLZT layer structures piled on the PbTiO$_3$ film.

The PbTiO$_3$ film is effective to provide a greater degree of flatness to the PZT ferroelectric thin film. Although the PbTiO$_3$ film has described as having a predetermined number of PbTiO$_3$ layer structures piled on the substrate, it is to be noted that the PbTiO$_3$ film may be have a single PbTiO$_3$ layer structure formed on the substrate.

BRIEF DESCRIPTION OF THE DRAWINGS

This invention will be described in greater detail by reference to the following description taken in connection with the accompanying drawings, in which.

DETAILED DESCRIPTION OF THE INVENTION

Figure 1:
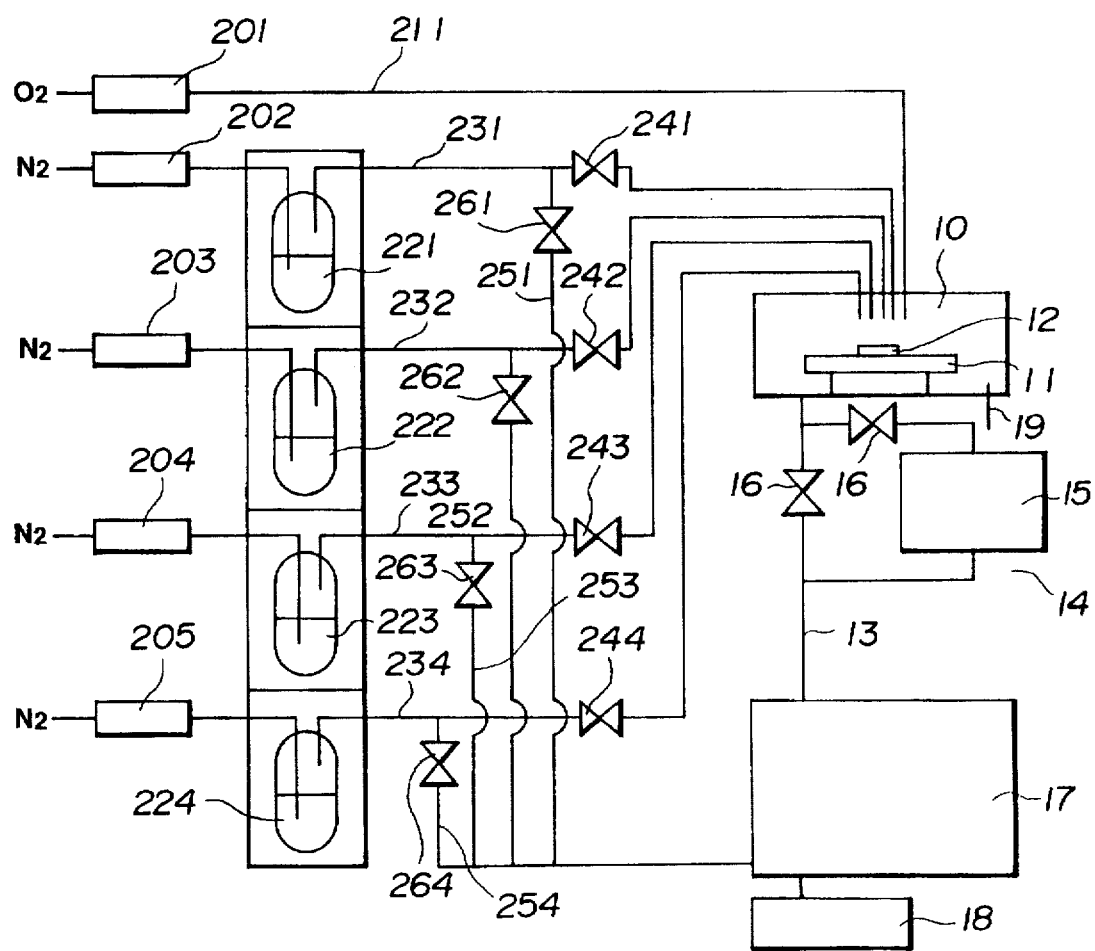
FIG. 1 is a schematic view showing a MOCVD apparatus used for producing a ferroelectric thin film according to the method of the invention.

With reference to FIG. 1, there is shown a schematic diagram of a metal-organic chemical vapor deposition (MOCVD) apparatus for use in producing PZT or PLZT ferroelectric thin films according to the method of the invention. The MOCVD apparatus includes a reaction chamber, designated generally by the numeral 10, which contains a susceptor 11 having a substrate 12 supported thereon. The susceptor 11 is heated to maintain the substrate 12 at a predetermined temperature. The reaction chamber 10 is connected to an exhaust line 13 including a pressure adjuster 14, an exhaust pump 17 and an exhaust purifier 18. The pressure adjuster 14, which includes a pump 15 and control valves 16, is used to set the reaction chamber 10 to have a predetermined back pressure (for example, 1.4 Torr). The reaction chamber 10 is also connected to a leakage line 19.

The MOCVD apparatus also includes sources of oxygen and nitrogen gases. The oxygen gas source (O$_2$) is connected to the reaction chamber 10 through an oxygen gas line 211 having a gas flow controller 201 placed therein for controlling the rate of oxygen gas flow through the oxygen gas line 211. The nitrogen gas source (N$_2$) is connected through a gas flow controller 202 to a first evaporator 221, through a gas flow controller 203 to a second evaporator 222, through a gas flow controller 204 to a third evaporator 223 and through a gas flow controller 205 to a fourth evaporator 224. Each of the gas flow controllers 202, 203, 204 and 205 operates to maintain a predetermined rate of flow of the nitrogen carrier gas to the corresponding one of the evaporators 221, 222, 223 and 224. The first evaporator 221 contains a Pb source material, a Pb organic compound such as $Pb(C_2H_5)_4$, which is evaporated therein. The first evaporator 221 is connected to the reaction chamber 10 through a first feed line 231 having a normally-closed introduction control valve 241. The introduction control valve 241 opens on a command from a control unit (not shown) to introduce the evaporated Pb source material from the first evaporator 221 into the reaction chamber 10. The first feed line 231 is connected, upstream of the introduction control valve 241, to the exhaust pump 17 through a first exhaust line 251 having a normally-closed exhaust control valve 261 placed therein. The exhaust control valve 261 opens on a command from the control unit to discharge the residual Pb source material from the first feed line 231. The second evaporator 222 contains a La source material, a La organic compound such as $La(DPM)_3$, which is evaporated therein. The second evaporator 222 is connected to the reaction chamber 10 through a second feed line 232 having a normally-closed introduction control valve 242. The introduction control valve 242 opens on a command from the control unit to introduce the evaporated La source material from the second evaporator 222 into the reaction chamber 10. The second feed line 232 is connected, upstream of the introduction control valve 242, to the exhaust pump 17 through a second exhaust line 252 having an exhaust control valve 262 placed therein. The exhaust control valve 262 opens on a command from the control unit to discharge the residual La source material from the second feed line 232. The third evaporator 223 contains a Ti source material, a Ti organic compound such as $Ti(i-OC_3H_7)_4$, which is evaporated therein. The third evaporator 223 is connected to the reaction chamber 10 through a third feed line 233 having a normally-closed introduction control valve 243. The introduction control valve 243 opens on a command from the control unit to introduce the evaporated Ti source material from the third evaporator 223 into the reaction chamber 10. The third feed line 233 is connected, upstream of the introduction control valve 243, to the exhaust pump 17 through a third exhaust line 253 having a normally-closed exhaust control valve 263 placed therein. The exhaust control valve 263 opens on a command from the control unit to discharge the residual Ti source material from the first feed line 233. The fourth evaporator 224 contains a Zr source material, a Zr organic compound such as $Zr(t-OC_4H_9)_4$, $Zr(DPM)_4$ or the like which is evaporated therein. The fourth evaporator 224 is connected to the reaction chamber 10 through a fourth feed line 234 having a normally-closed introduction control valve 244. The introduction control valve 244 opens on a command from the control unit to introduce the evaporated Zr source material from the fourth evaporator 224 into the reaction chamber 10. The fourth feed line 234 is connected, upstream of the introduction control valve 244, to the exhaust pump 17 through a fourth exhaust line 254 having a normally-closed exhaust control valve 264 placed therein. The exhaust control valve 264 opens on a command from the control unit to discharge the residual Zr source material from the fourth feed line 234.

Figure 2:
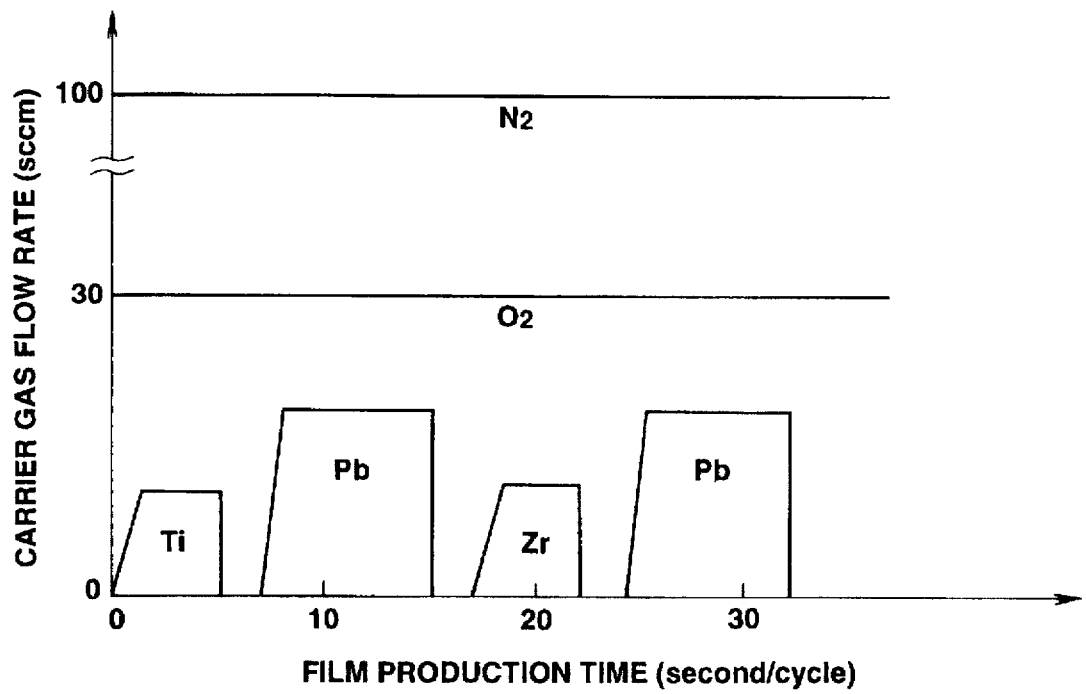
FIG. 2 is a graph used in explaining one of the source material introduction cycle patterns performed according to the method of the invention.

The operation of the MOCVD apparatus will be described with reference to FIG. 2 which shows one cycle of introduction of the source materials into the reaction chamber 10 effected in producing a PZT monomolecular layer on the substrate 12. The susceptor 11 was set to maintain the substrate 12 at a temperature of about 500° C. The pressure adjuster 14 was set to provide a back pressure of 1.4 Torr in the reaction chamber 10. The gas flow controller 201 was set to introduce the oxygen gas at a flow rate of 30 sccm in to the reaction chamber 10. The gas flow controller 202 was set to adjust the rate of flow of $N_2$ carrier gas to the first evaporator 221 at 16.4 sccm. The gas flow controller 204 was set to adjust the rate of flow of $N_2$ carrier gas to the third evaporator 223 at 19.3 sccm. The gas flow controller 205 was set to adjust the rate of flow of $N_2$ carrier gas to the fourth evaporator 224 at 11.3 sccm. The gas flow controller 203 is set to block the flow of the $N_2$ carrier gas to the second evaporator 222. The rate of flow of the nitrogen gas was 100 sccm.

First of all, a command was produced from the control unit to open the introduction control valve 243 with the exhaust control valve 263 held closed. As a result, the Ti source material was introduced from the third evaporator 223 into the reaction chamber 10. The temperature of the Ti source material was 30° C. The introduction control valve 243 was held open for 5 seconds. Thereafter, a command was produced to close the introduction control valve 243 and open the exhaust control valve 263. The exhaust control valve 263 was held open for a predetermined time (for example, 2 seconds) to discharge the residual Ti source material from the third feed line 233.

Upon completion of this Ti source material introduction phase, a command was produced from the control unit to open the introduction control valve 241 with the exhaust control valve 261 held closed. As a result, the Pb source material was introduced from the first evaporator 221 into the reaction chamber 10. The temperature of the Pb source material was 5° C. The introduction control valve 241 was held open for 8 seconds. Thereafter, a command was produced to close the introduction control valve 241 and open the exhaust control valve 261. The exhaust control valve 261 was held open for a predetermined time (for example, 2 seconds) to discharge the residual Pb source material from the third feed line 231.

Upon completion of this Pb source material introduction phase, a command was produced from the control unit to open the introduction control valve 244 with the exhaust control valve 264 held closed. As a result, the Zr source material was introduced from the fourth evaporator 224 into the reaction chamber 10. The temperature of the Zr source material was 30° C. The introduction control valve 244 was held open for 5 seconds. Thereafter, a command was produced to close the introduction control valve 244 and open the exhaust control valve 264. The exhaust control valve 264 was held open for a predetermined time (for example, 2 seconds) to discharge the residual Zr source material from the fourth feed line 234.

Upon completion of this Zr source material introduction phase, a command was produced from the control unit to open the introduction control valve 241 with the exhaust control valve 261 held closed. As a result, the Pb source material was introduced from the first evaporator 221 into the reaction chamber 10. The temperature of the Pb source material was 5° C. The introduction control valve 241 was held open for 8 seconds. Thereafter, a command was produced to close the introduction control valve 241 and open the exhaust control valve 261. The exhaust control valve 261 was held open for a predetermined time (for example, 2 seconds) to discharge the residual Pb source material from the third feed line 231.

The source material introduction cycle was repeated to produce a predetermined thickness of PZT thin film on the substrate 12. The thickness of the elements or elemental oxides of the PZT thin film produced per a source material introduction cycle (Å/cycle) is an important factor contributing to whether the amounts of the elements of the PZT mono- or multi-layer are correct to provide a predetermined stoichiometric composition. Therefore, the rate of flow of each of the source materials, that is, the rate of flow of the carrier gas for the source material supply should be determined to provide a desired thickness of elemental thin film produced per a source material introduction cycle (Å/cycle). The parameters which determine the film thickness ((Å/cycle) include the period of time during which the source materials are introduced into the reaction chamber per a source material introduction cycle (second/cycle), the rate (sccm) of flow of the carrier gas, the source temperature (°C.), the rate (sccm) of flow of the oxygen gas, the substrate temperature (°C.), the back pressure (Torr), the exhaust time period (second), etc. The back pressure and the exhaust time period are fixed.

Figure 3:
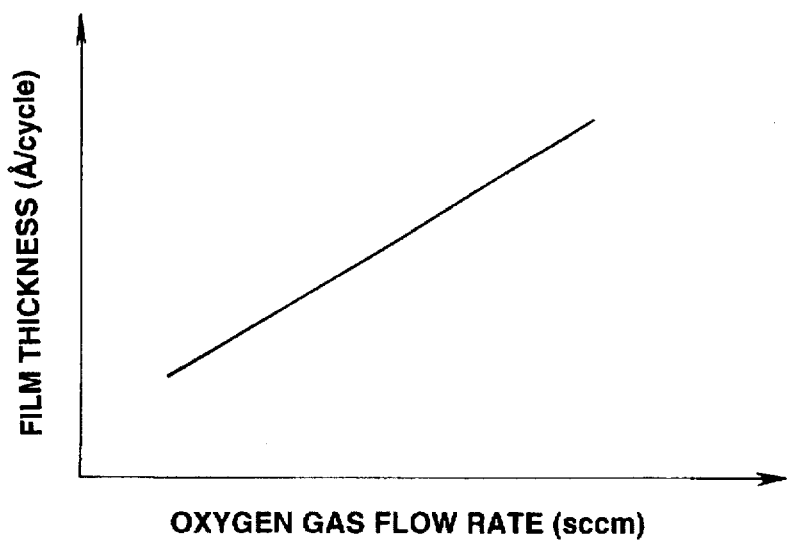
FIG. 3 is a graph of film thickness versus oxygen gas flow rate.

The relationship between thickness (Å/cycle) of the thin film produced in per a source material introduction cycle (Å/cycle) and the rate (sccm) of flow of the oxygen gas into the reaction chamber 10 is shown in FIG. 3. It can be seen from FIG. 3 that the film thickness is substantially in a linear relationship with respect to the rate of flow of the oxygen gas into the reaction chamber 10. In this case, the oxygen gas flow rate is fixed at 30 sccm.

Figure 4:
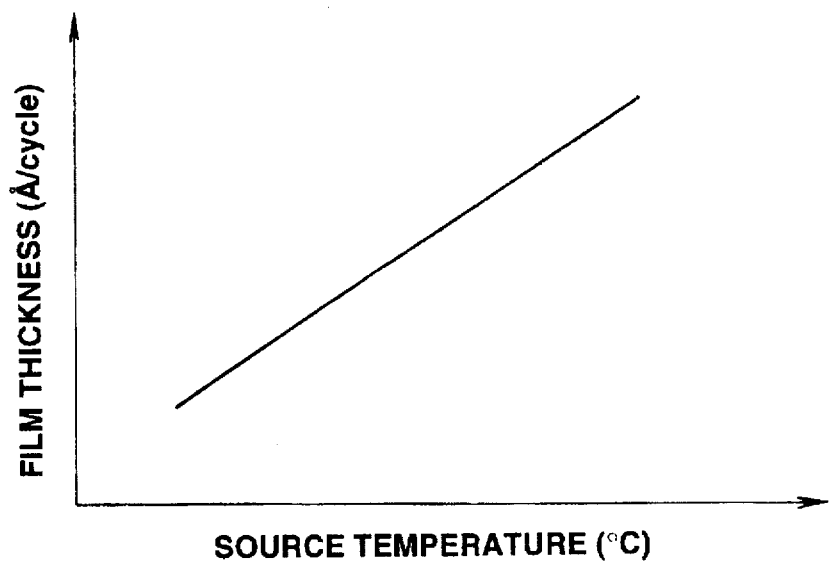
FIG. 4 is a graph of film thickness versus source temperature.

The relationship between the thickness of the elemental thin film produced per a source material introduction cycle (Å/cycle) and the source temperature (°C.) is shown in FIG. 4. It can be seen from FIG. 4 that the film thickness is substantially in a linear relationship with respect to the source temperature. The gradient of the film thickness with respect to the source temperature is dependent on the kind of the source material. Since a complex and difficult control is required with the source temperature being taken as a variable, it is preferable to set the source temperature at a fixed value.

Figure 5:
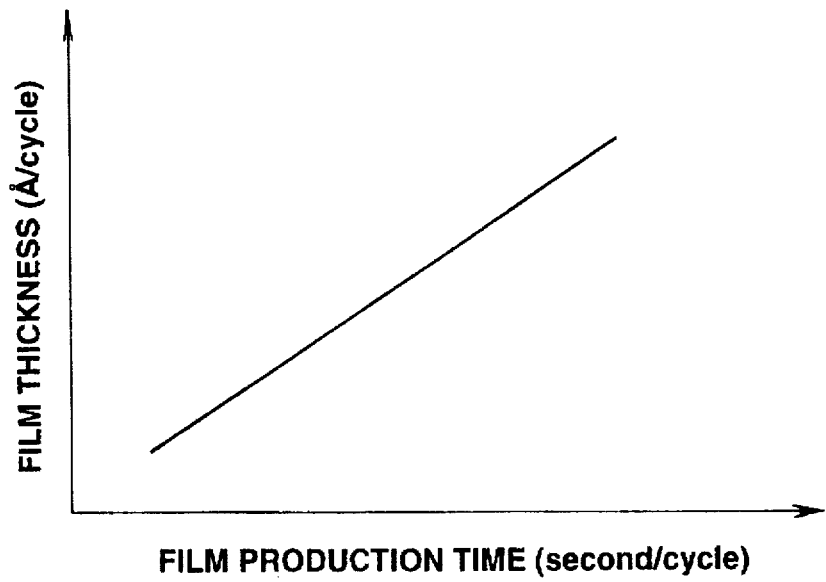
FIG. 5 is a graph of film thickness versus film production time.

The relationship between the thickness of the elemental thin film produced per a source material introduction cycle (Å/cycle) and the time during the thin film production is shown in FIG. 5. It can be seen from FIG. 5 that the film thickness is substantially in a linear relationship with respect to the thin film production time. The thin film production time increases if the source material introduction time is elongated. This is not practicable.

Figure 6:
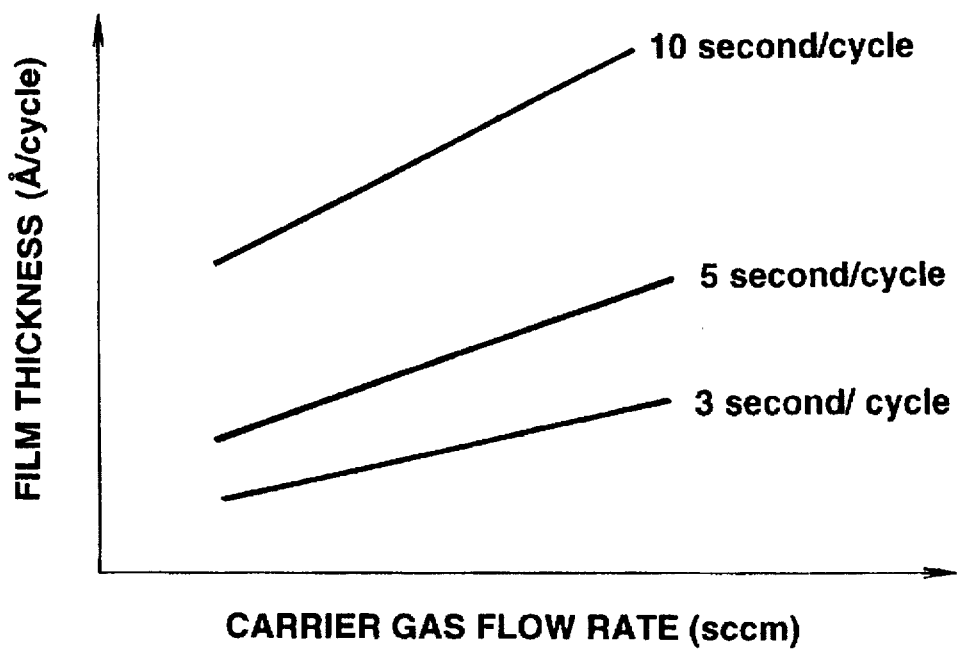
FIG. 6 is a graph of a family of curves representing film thickness versus carrier gas flow rate, each curve being for a different film production time.

The relationship between the thickness of the thin film produced per a source material introduction cycle (Å/cycle) and the rate of flow of the carrier gas is shown in FIG. 6. It can be seen from FIG. 6 that the film thickness is substantially in a linear relationship with respect to the carrier gas flow rate within a predetermined range. If the carrier gas flow rate decreases, it is more difficult to maintain the accuracy of operation of the gas flow controllers. In this case, the carrier gas flow rate is determined in connection with the time of introduction of each of the source materials.

Figure 7:
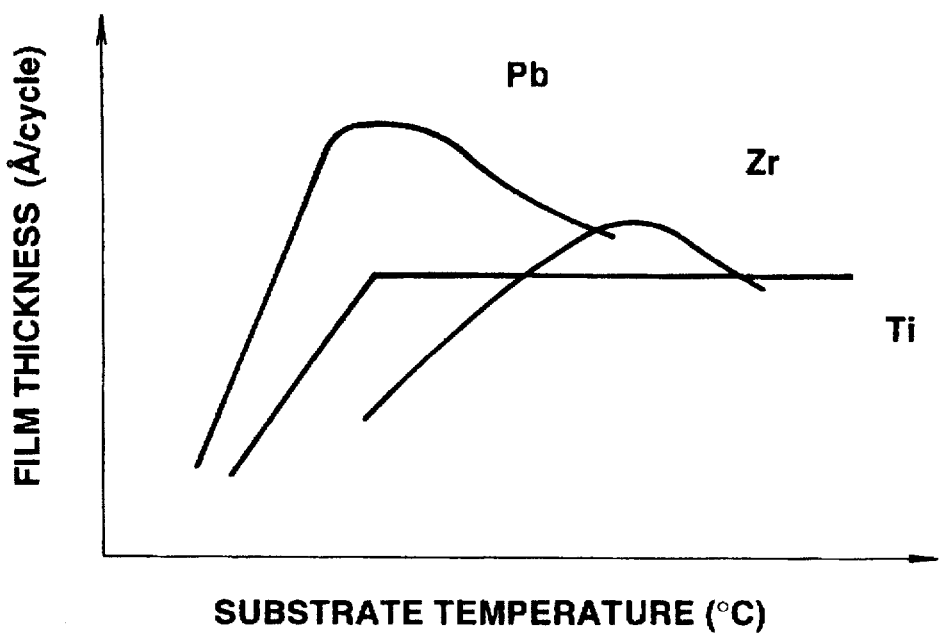
FIG. 7 is a graph of a family of curves representing film thickness versus substrate temperature, each curve being for a different source material.

The relationship between the thickness of the thin film produced per a source material introduction cycle (Å/cycle) and the substrate temperature is shown in FIG. 7. It can be seen from FIG. 7 that the film thickness has a complex relationship with respect to the substrate temperature. Therefore, it is required to determine the thickness of the thin film produced per a source material introduction cycle (Å/cycle) based on the substrate temperature and adjust the carrier gas flow rate and introduction time in an appropriate manner to provide the determined thin film thickness.

Although the invention has been described in connection with production of a PZT ferroelectric thin film, it is to be noted that similar discussions are applicable to production of a PLZT ferroelectric thin film. Although the invention has been described in connection with a carrier gas taken in the form of nitrogen gas, it is to be noted that argon or other inert gases may be used in place of the nitrogen gas.

Figure 8:
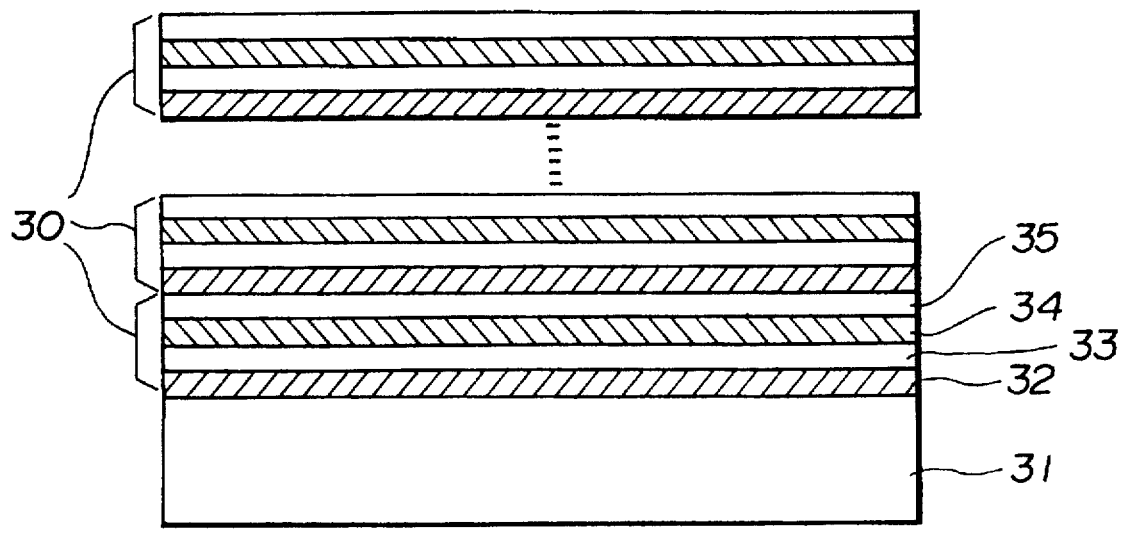
FIG. 8 is a sectional view of a PZT ferroelectric thin film produced according to the method of the invention.

Referring to FIG. 8, there is shown a PZT ferroelectric thin film produced on a substrate 31 placed in an atmosphere of $O_2$ and/or $O_3$ within the reaction chamber 10. As described in connection with FIG. 2, Ti, Pb, Zr and Pb source materials are separately introduced successively in this order into the reaction chamber 10 so as to produce a layer structure 30 having a stoichiometric composition given as $Pb(Zr_xTi_{1-x})O_3$ where $0<x<1$ in one cycle of introduction of source materials. This layer structure 30 includes a Ti (or $TiO_2$) layer 32, a Pb (or PbO) layer 33, a Zr (or $ZrO_2$) layer 34 and a Pb (or PbO) layer 35 piled in this order on the substrate 31. Then this layer structure 30 is transformed into a PZT mono- or multi-layer structure by thermal energy of the heated substrate 31. The source material introduction cycle is repeated at a predetermined number of times to produce the PZT ferroelectric thin film having a predetermined number of PZT layer structures 30 piled on the substrate 31.

Similarly, a PLZT ferroelectric thin film may be produced on a substrate placed in an atmosphere of $O_2$ and/or $O_3$ within the reaction chamber 10. In this case, Ti, Pb, La, Zr, Pb and La source materials are separately introduced successively in this order into the reaction chamber 10 so as to produce a PLZT mono- or multi-layer structure having a stoichiometric composition given as $(Pb_{1-y}La_y)(Zr_xTi_{1-x})_{1-y/4}O_3$ where $0<x<1$ and $0<y<1$ in one cycle of introduction of source materials. The PLZT layer structure includes Ti (or $TiO_2$), Pb (or PbO), La (or $La_2O_3$), Zr (or $ZrO_2$), Pb (or PbO) and La (or $La_2O_3$) layers piled in this order on the substrate. The source material introduction cycle is repeated at a predetermined number of times to produce the PLZT ferroelectric thin film having a predetermined number of PLZT layer structures piled on the substrate. Another type of PLZT ferroelectric thin film may be produced on a substrate placed in an atmosphere of $O_2$ and/or $O_3$ within the reaction chamber 10. In this case, Ti, La, Pb, Zr, La and Pb source materials are separately introduced successively in this order in to the reaction chamber 10 so as to produce a PLZT mono- or multi-layer structure having a stoichiometric composition given as $(Pb_{1-y}La_y)(Zr_xTi_{1-x})_{1-y/4}O_3$ where $0<x<1$ and $0<y<1$ in one cycle of introduction of source materials. The PLZT layer structure includes Ti (or $TiO_2$), La (or $La_2O_3$), Pb (or PbO), Zr (or $ZrO_2$), La (or $La_2O_3$) and Pb (or PbO) layers piled in this order on the substrate. The source material introduction cycle is repeated at a predetermined number of times to produce the PLZT ferroelectric thin film having a predetermined number of PLZT layer structures piled on the substrate.

Figure 9:
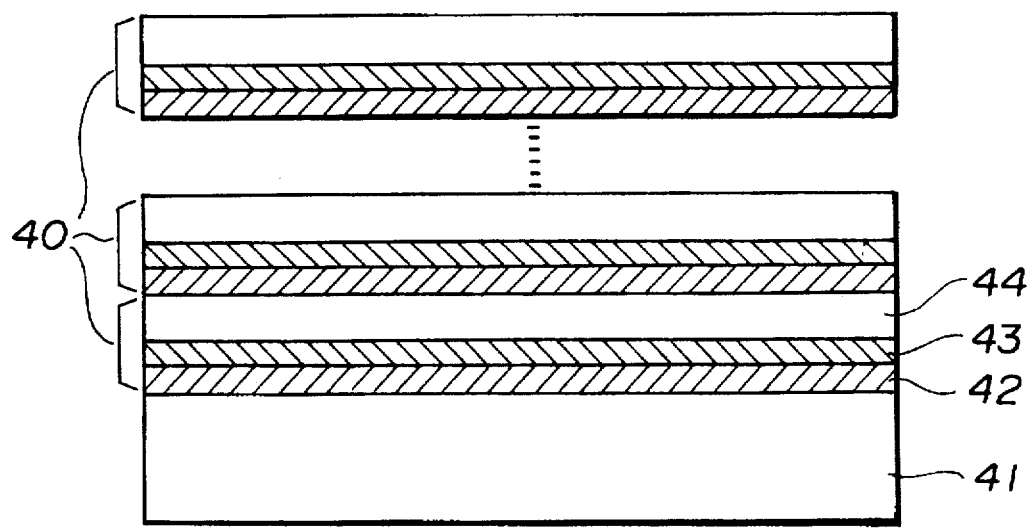
FIG. 9 is a sectional view of another PZT ferroelectric thin film produced according to the method of the invention.

Referring to FIG. 9, there is shown another type of PZT ferroelectric thin film produced on a substrate 41 placed in an atmosphere of $O_2$ and/or $O_3$ within the reaction chamber 10. Ti, Zr and Pb source materials are separately introduced successively in this order into the reaction chamber 10 so as to produce a PZT mono- or multi-layer structure 40 having a stoichiometric composition given as $Pb(Zr_xTi_{1-x})O_3$ where $0<x<1$ in one cycle of introduction of source materials. The PZT layer structure 40 includes a Ti (or $TiO_2$) layer 42, a Zr (or $ZrO_2$) layer 43 and a Pb (or PbO) layer 44 piled in this order on the substrate 41. The source material introduction cycle is repeated at a predetermined number of times to produce the PZT ferroelectric thin film having a predetermined number of PZT layer structures 40 piled on the substrate 41.

Similarly, a PLZT ferroelectric thin film may be produced on a substrate placed in an atmosphere of $O_2$ or $O_3$ within the reaction chamber 10. In this case, Ti, Zr, Pb and La source materials are separately introduced successively in this order into the reaction chamber 10 so as to produce a PLZT mono- or multi-layer structure having a stoichiometric composition given as $(Pb_{1-y}La_y)(Zr_xTi_{1-x})_{1-y/4}O_3$ where $0<x<1$ and $0<y<1$ in one cycle of introduction of source materials. The PLZT layer structure includes Ti (or $TiO_2$), Zr (or $ZrO_2$), Pb (or PbO) and La (or $La_2O_3$) layers piled in this order on the substrate. The source material introduction cycle is repeated at a predetermined number of times to produce the PLZT ferroelectric thin film having a predetermined number of PLZT layer structures piled on the substrate. Another type of PLZT ferroelectric thin film may be produced on a substrate placed in an atmosphere of $O_2$ and/or $O_3$ within the reaction chamber 10. In this case, Ti, Zr, La and Pb source materials are separately introduced successively in this order into the reaction chamber 10 so as to produce a PLZT mono- or multi-layer structure having a stoichiometric composition given as $(Pb_{1-y}La_y)(Zr_xTi_{1-x})_{1-y/4}O_3$ where $0<x<1$ and $0<y<1$ in one cycle of introduction of source materials. The PLZT layer structure includes Ti (or $TiO_2$), Zr (or $ZrO_2$), La (or $La_2O_3$) and Pb (or PbO) layers piled in this order on the substrate. The source material introduction cycle is repeated at a predetermined number of times to produce the PLZT ferroelectric thin film having a predetermined number of PLZT layer structures piled on the substrate.

Figure 10:
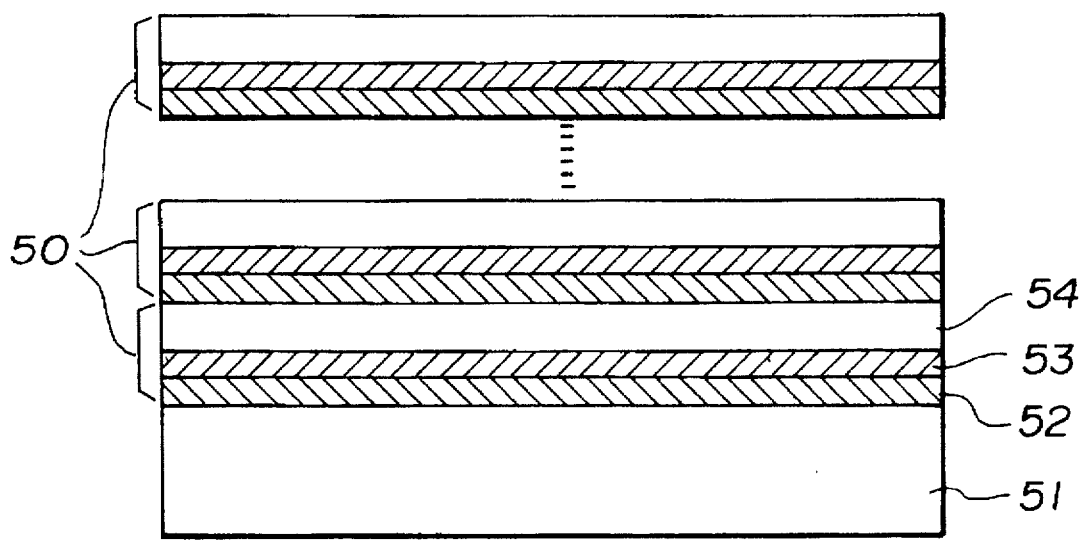
FIG. 10 is a sectional view of another PZT ferroelectric thin film produced according to the method of the invention.

Referring to FIG. 10, there is shown another type of PZT ferroelectric thin film produced on a substrate 51 placed in an atmosphere of $O_2$ and/or $O_3$ within the reaction chamber 10. Zr, Ti, and Pb source materials are separately introduced successively in this order into the reaction chamber 10 so as to produce a PZT mono- or multi-layer structure 50 having a stoichiometric composition given as $Pb(Zr_xTi_{1-x})O_3$ where $0<x<1$ in one cycle of introduction of source materials. The PZT layer structure 50 includes a Zr (or $ZrO_2$) layer 52, a Ti (or $TiO_2$) layer 53 and a Pb (or PbO) layer 54 piled in this order on the substrate 51. The source material introduction cycle is repeated at a predetermined number of times to produce the PZT ferroelectric thin film having a predetermined number of PZT layer structures 50 piled on the substrate 51.

Similarly, a PLZT ferroelectric thin film may be produced on a substrate placed in an atmosphere of $O_2$ and/or $O_3$ within the reaction chamber 10. In this case, Zr, Ti, Pb and La source materials are separately introduced successively in this order into the reaction chamber 10 so as to produce a PLZT mono- or multi-layer structure having a stoichiometric composition given as $(Pb_{1-y}La_y)(Zr_xTi_{1-x})_{1-y/4}O_3$ where $0<x<1$ and $0<y<1$ in one cycle of introduction Of source materials. The PLZT layer structure includes Zr (or $ZrO_2$), Ti (or $TiO_2$), Pb (or PbO) and La (or $La_2O_3$) layers piled in this order on the substrate. The source material introduction cycle is repeated at a predetermined number of times to produce the PLZT ferroelectric thin film having a predetermined number of PLZT layer structures piled on the substrate. Another type of PLZT ferroelectric thin film may be produced on a substrate placed in an atmosphere of $O_2$ and/or $O_3$ within the reaction chamber 10. In this case, Zr, Ti, La and Pb source materials are separately introduced successively in this order into the reaction chamber 10 so as to produce a PLZT mono- or multi-layer structure having a stoichiometric composition given as $(Pb_{1-y}La_y)(Zr_xTi_{1-x})_{1-y/4}O_3$ where $0<x<1$ and $0<y<1$ in one cycle of introduction of source materials. The PLZT layer structure includes Zr (or $ZrO_2$), Ti (or $TiO_2$), La (or $La_2O_3$) and Pb (or PbO) layers piled in this order on the substrate. The source material introduction cycle is repeated at a predetermined number of times to produce the PLZT ferroelectric thin film having a predetermined number of PLZT layer structures piled on the substrate.

Figure 11:
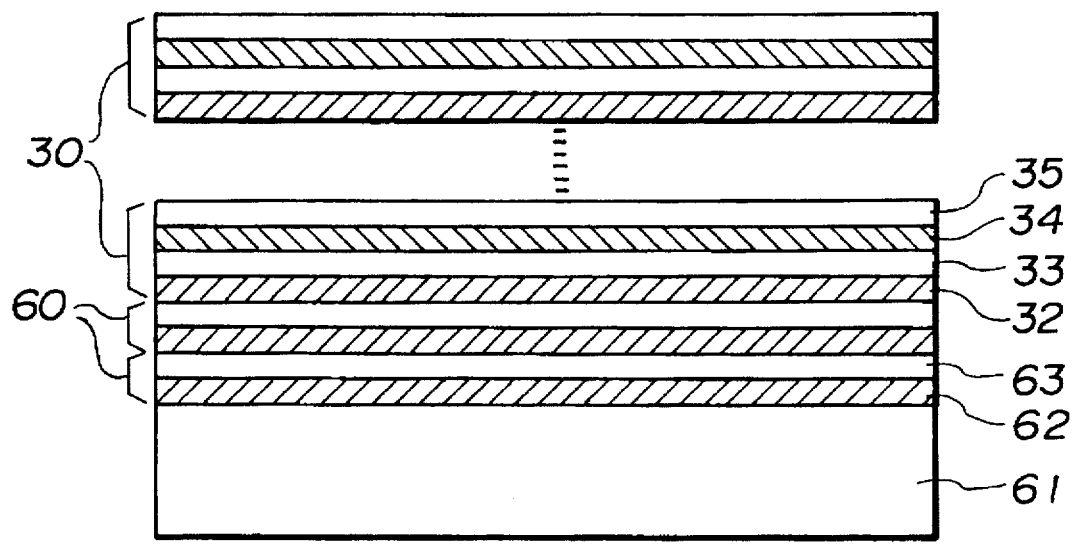
FIG. 11 is a sectional view of another PZT ferroelectric thin film produced according to the method of the invention.

Referring to FIG. 11, there is shown another type of PZT ferroelectric thin film produced on a substrate 61 placed in an atmosphere of $O_2$ and/or $O_3$ within the reaction chamber 10. Ti and Pb source materials are introduced separately and successively into the reaction chamber 10 to produce a $PbTiO_3$ buffer layer structure having Ti (or $TiO_2$) and Pb (or PbO) layers 62 and 63 piled in this order on the substrate 61. This source material introduction may be repeated a predetermined number of times to produce a $PbTiO_3$ buffer film having a predetermined number of $PbTiO_3$ buffer layer structures piled on the substrate 61. A predetermined number of PZT or PLZT layer structures are piled on the $PbTiO_3$ buffer layer structure(s) 60 in such a manner as described in connection with FIGS. 8–10. In the illustrated case, a predetermined number of PZT mono- or multi-layer structure 30 (FIG. 8) are piled on the buffer layer structures 60. The buffer layer structure(s) 60 are effective to provide a higher degree of flatness to the produced ferroelectric thin film.

Figure 12:
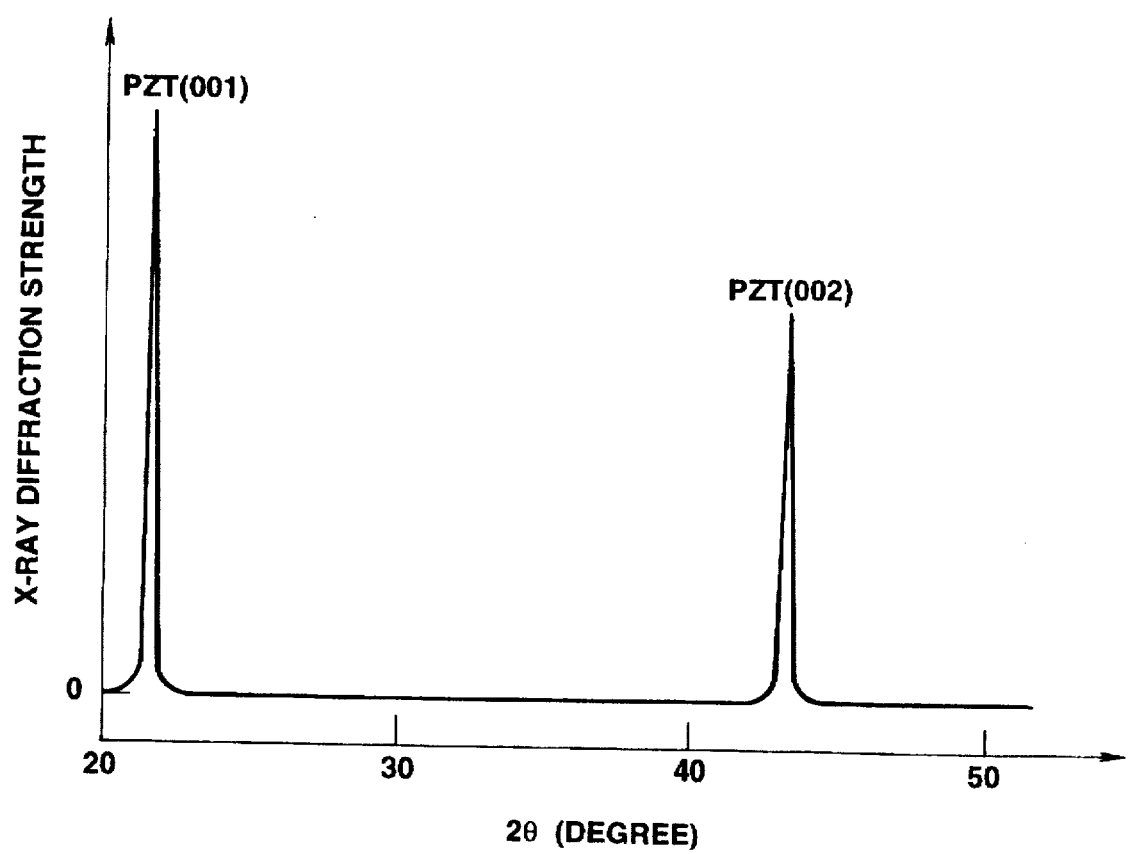
FIG. 12 is a graph of X-ray diffraction strength versus angle.
Figure 13:
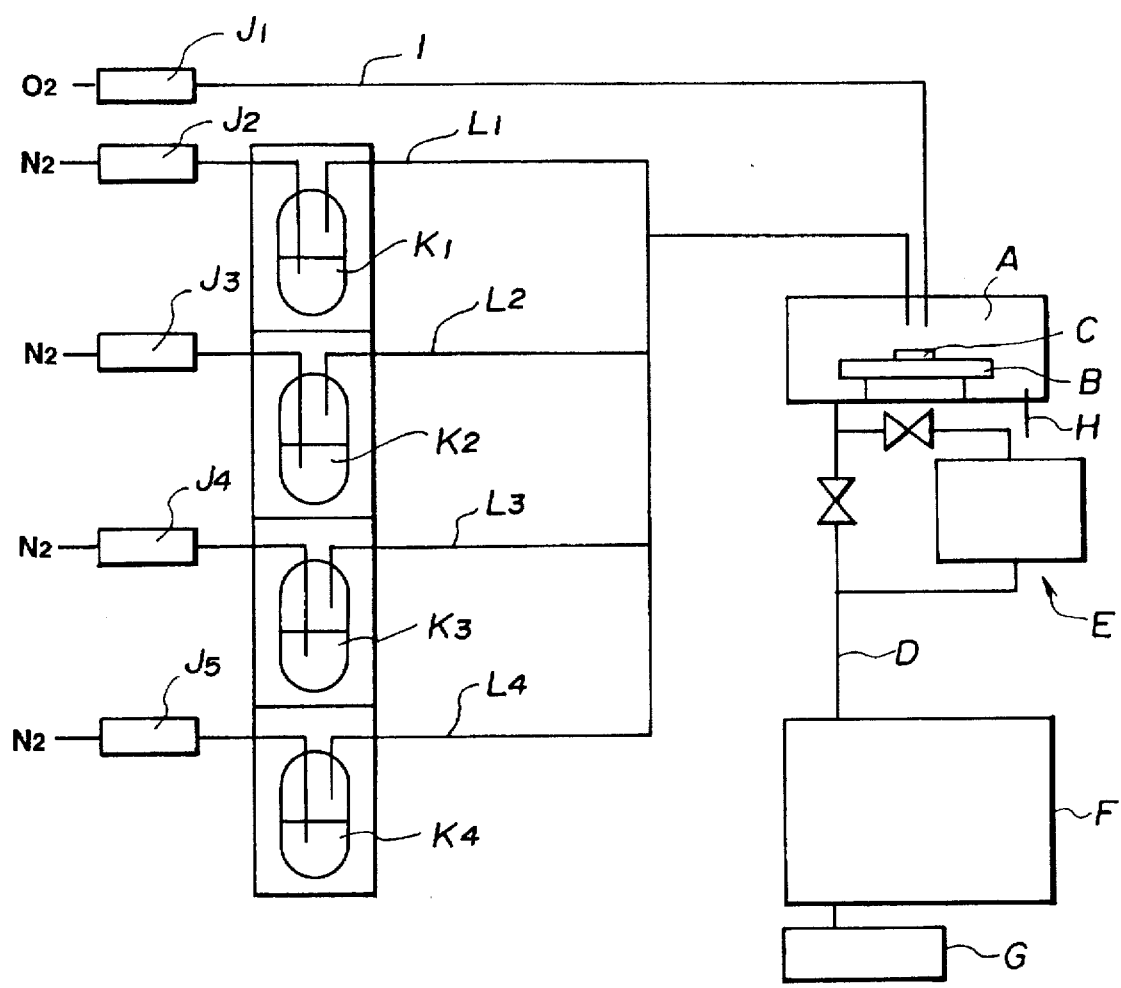
FIG. 13 is a schematic view showing one example of ferroelectric thin film producing apparatus utilizing a MOCVD method.

FIG. 12 shows one example of X-ray diffraction pattern of the PZT ferroelectric thin film produced in such a manner as described in connection with FIG. 8. The PZT ferroelectric thin film was produced by repeating 250 source material introduction cycles and had a thickness of about 1030 Å. The ferroelectric thin film was a c-axis orientation film exhibiting PZT(001) and it had no diffraction pattern other than the diffraction peak from the substrate. It can be seen from its SEM image that its surface has a high degree of flatness and from its sectional image that it is an epitaxial film.

A series of evaluations were conducted to show the conditions of the PZT ferroelectric thin films produced in different source material introduction sequences or orders. The evaluation results are shown in the following tables:

| NO | SEQUENCE | QUALITY |
|---|---|---|
| 1 | Pb—Ti—Zr—Pb | POOR |
| 2 | Pb—Zr—Ti—Pb | POOR |
| 3 | Pb—Ti—Pb—Zr | POOR |
| 4 | Pb—Zr—Pb—Ti | POOR |
| 5 | Zr—Pb—Ti—Pb | POOR |
| 6 | Zr—Ti—Pb | GOOD |
| 7 | Ti—Zr—Pb | GOOD |
| 8 | Ti—Pb—Zr—Pb | GOOD |
| 9 | Ti—Pb, Ti—Pb—Zr—Pb | GOOD |
| 10 | Ti—Pb, Zr—Ti—Pb | GOOD |
| 11 | Ti—Pb, ti—Zr—Pb | GOOD |
| 12 | Tix2—Pbx2—Zrx2—Pbx2 | GOOD |
| 13 | Tix3—Pbx3—Zrx3—Pbx3 | GOOD |

The PZT ferroelectric thin films Nos. 1–4 exhibited a poor degree of flatness and a poor crystallinity due to desorption of the Pb or PbO layer piled first on the substrate. The PZT ferroelectric thin film No. 5 was produced with Zr source material introduction followed by Pb source material introduction. However, the PZT ferroelectric thin film No. 5 exhibited a poor degree of flatness and a poor crystallinity due to Zr or $ZrO_2$ segregation. The PZT ferroelectric thin film No. 6 was produced with Zr source material introduction followed by Ti source material introduction. The PZT ferroelectric thin film No. 6 exhibited a good surface flatness and a good crystallinity. In this case, the quantity which the Pb source material is introduced into the reaction chamber was doubled of the quantity described in connection with FIG. 2. The PZT ferroelectric thin films Nos. 7–13, which were produced with the Ti source material introduced first into the reaction chamber, were free from the problems of Pb or PbO layer desorption and Zr or $ZrO_2$ segregation. The PZT ferroelectric thin films Nos. 9–11 exhibited a great effect of the $PbTiO_3$ buffer layer structure to improve the flatness of the PZT ferroelectric thin film. For the PZT ferroelectric thin films Nos. 1–11, PZT layer formed in one source material introduction cycle is monomolecular layer. For the PZT ferroelectric thin films Nos. 12 and 13, PZT layer formed in one source material introduction cycle is multimonomolecular layer.

The film production was also possible maintained a substrate temperature ranging from 350° C. to 750° C. other than 500° C. at which PZT thin films were produced as discussed above. The film production was possible on the substrate made of Pt, $SiO_2$, SiN, TiN, a Si single crystal, an oxided single crystal, or on the substrate formed on its front surface on which the ferroelectric thin film is to be produced, with a film made of Pt, SiO2, SiN and TiN, a Si single crystal film, or an oxided single crystal film. The oxided single crystal may be MgO, $Al_2O_3$, $SrTiO_3$ or the like.

What is claimed is:

1. A method of producing a ferroelectric thin film on a substrate placed on a susceptor in a reaction chamber, comprising the steps of:
   (a) heating the substrate and introducing $O_2$ and/or $O_3$ gases into the reaction chamber to provide an oxygen gas atmosphere therein;
   (b) producing a PZT layer structure having a stoichiometric composition given as Pb $(Zr_xTi_{1-x})O_3$ where 0<x<1 by introducing evaporated Ti source material into the reaction chamber via a first feed line to produce a first layer which is one of Ti and $TiO_2$ layers having a thickness, then, after formation of said first layer, introducing evaporated Pb source material into the reaction chamber via a second feed line to produce a second layer which is one of Pb and PbO layers having a thickness on said first layer, then, after formation of said second layer, introducing evaporated Zr source material into the reaction chamber via a third feed line to produce a third layer which is one of Zr and $ZrO_2$ layers having a thickness on said second layer, and, after formation of said third layer, introducing evaporated Pb source material into the reaction chamber via a fourth feed line to produce a fourth layer which is one of Pb and PbO layers having a thickness on said third layer so as to produce a PZT layer structure having said first, second, third and fourth layers, the first, second, third and fourth feed lines separate from each other to avoid mixing or reaction of the evaporated source materials with each other prior to introduction into the reaction chamber; and
   (c) continuously repeating the sequence of the step (b) a number of times until a PZT ferroelectric thin film having a plurality of said PZT layer structures on the substrate is formed.

2. The ferroelectric thin film producing method as claimed in claim 1, wherein the Pb source material is $Pb(C_2H_5)_4$, the Zr source material is $Zr(t-OC_4H_9)_4$, and the Ti source material is $Ti(i-OC_3H_7)_4$.

3. The ferroelectric thin film producing method as claimed in claim 1, wherein the substrate is maintained at a temperature ranging from 350° C. to 750° C. during the step (b).

4. The ferroelectric thin film producing method as claimed in claim 1, wherein the substrate is made of one selected from the group consisting of Pt, SiO2, SiN and TiN.

5. The ferroelectric thin film producing method as claimed in claim 1, wherein the substrate is made of Si single crystal.

6. The ferroelectric thin film producing method as claimed in claim 1, wherein the substrate is made of an oxidized single crystal.

7. The ferroelectric thin film producing method as claimed in claim 6, wherein the oxidized single crystal is one selected from the group consisting of MgO, $Al_2O_3$ and $SrTiO_3$.

8. The ferroelectric thin film producing method as claimed in claim 1, wherein the substrate has a front surface on which the ferroelectric thin film is to be produced, the substrate being formed on the front surface with a film made of one selected from the group consisting of Pt, $SiO_2$, SiN and TiN.

9. The ferroelectric thin film producing method as claimed in claim 1, wherein the substrate has a front surface on which the ferroelectric thin film is to be produced, the substrate being formed on the front surface with a Si single crystal film.

10. The ferroelectric thin film producing method as claimed in claim 1, wherein the substrate has a front surface on which the ferroelectric thin film is to be produced, the substrate being formed on the front surface with an oxidized single crystal film.

11. The ferroelectric thin film producing method as claimed in claim 10, wherein the oxidized single crystal is one selected from the group consisting of MgO, $Al_2O_3$ and $SrTiO_3$.

12. The method of claim 1 further comprising the step of, during producing step (b), discharging one evaporated source material from in the reaction chamber prior to introducing a subsequent evaporated source material.

13. A method of producing a ferroelectric thin film on a substrate placed on a susceptor in a reaction chamber, comprising the steps of:
   (a) heating the substrate and introducing $O_2$ and/or $O_3$ gases into the reaction chamber to provide an oxygen gas atmosphere therein;
   (b) producing a PZT layer structure having a stoichiometric composition given as Pb $(Zr_xTi_{1-x}) O_3$ where 0<x<1 by introducing evaporated Ti source material into the reaction chamber via a first feed line to produce a first layer which is one of Ti and $TiO_2$ layers having a thickness, then, after formation of said first layer, introducing evaporated Zr source material into the reaction chamber via a second feed line to produce a second layer which is one of Zr and $ZrO_2$ layers having a thickness on said first layer, then, after formation of said second layer, introducing evaporated Pb source material into the reaction chamber via a third feed line to produce a third layer which is one of Pb and PbO layers having a thickness on said second layer, so as to produce a PZT layer structure having said first, second and third layers, the first, second, third feed lines separate from each other to avoid mixing or reaction of the evaporated source materials with each other prior to introduction into the reaction chamber; and
   (c) continuously repeating the sequence of the step (b) a number of times until a PZT ferroelectric thin film having a plurality of said PZT layer structures on the substrate is formed.

14. The ferroelectric thin film producing method as claimed in claim 13, wherein the Pb source material is $Pb(C_2H_5)_4$, the Zr source material is $Zr(t-OC_4H_9)_4$, and the Ti source material is $Ti(i-OC_3H_7)_4$.

15. The ferroelectric thin film producing method as claimed in claim 13, wherein the substrate is maintained at a temperature ranging from 350° C. to 750° C. during the step (b).

16. The ferroelectric thin film producing method as claimed in claim 13, wherein the substrate is made of one selected from the group consisting of Pt, $Si_2$, SiN and TiN.

17. The ferroelectric thin film producing method as claimed in claim 13, wherein the substrate is made of Si single crystal.

18. The ferroelectric thin film producing method as claimed in claim 13, wherein the substrate is made of an oxidized single crystal.

19. The ferroelectric thin film producing method as claimed in claim 18, wherein the oxidized single crystal is one selected from the group consisting of MgO, $Al_2O_3$ and $SrTiO_3$.

20. The ferroelectric thin film producing method as claimed in claim 13, wherein the substrate has a front surface on which the ferroelectric thin film is to be produced, the substrate being formed on the front surface with a film made of one selected from the group consisting of Pt, $SiO_2$, SiN and TiN.

21. The ferroelectric thin film producing method as claimed in claim 13, wherein the substrate has a front surface on which the ferroelectric thin film is to be produced, the substrate being formed on the front surface with a Si single crystal film.

22. The ferroelectric thin film producing method as claimed in claim 13, wherein the substrate has a front surface on which the ferroelectric thin film is to be produced, the substrate being formed on the front surface with an oxidized single crystal film.

23. The ferroelectric thin film producing method as claimed in claim 22, wherein the oxidized single crystal is one selected from the group consisting of MgO, $Al_2O_3$ and $SrTiO_3$.

24. A method of producing a ferroelectric thin film on a substrate placed on a susceptor in a reaction chamber, comprising the steps of:

(a) heating the substrate and introducing $O_2$ and/or $O_3$ gases into the reaction chamber to provide an oxygen gas atmosphere therein;

(b) producing a PZT layer structure having a stoichiometric composition given as Pb $(Zr_xTi_{1-x})$ $O_3$ where $0<x<1$ by introducing evaporated Zr source material into the reaction chamber via a first feed line to produce a first layer which is one of Zr and $ZrO_2$ layers having a thickness, then, after formation of said first layer, introducing evaporated Ti source material into the reaction chamber via a second feed line to produce a second layer which is one of Ti and $TiO_2$ layers having a thickness on said first layer, then, after formation of said second layer, introducing evaporated Pb source material into the reaction chamber via a third feed line to produce a third layer which is one of Pb and PbO layers having a thickness on said second layer, so as to produce a PZT layer structure having said first, second and third layers, the first, second and third feed lines separate from each other to avoid mixing or reaction of the evaporated source materials with each other prior to introduction into the reaction chamber; and (c) continuously repeating the sequence of the step (b) a number of times until a PZT ferroelectric thin film having a plurality of said PZT layer structures on the substrate is formed.

25. The ferroelectric thin film producing method as claimed in claim 24, wherein the Pb source material is $Pb(C_2H_5)_4$, the Zr source material is $Zr(t-OC_4H_9)_4$, and the Ti source material is $Ti(i-OC_3H_7)_4$.

26. The ferroelectric thin film producing method as claimed in claim 24, wherein the substrate is maintained at a temperature ranging from 350° C. to 750° C. during the step (b).

27. The ferroelectric thin film producing method as claimed in claim 24, wherein the substrate is made of one selected from the group consisting of Pt, $SiO_2$, SiN and TiN.

28. The ferroelectric thin film producing method as claimed in claim 24, wherein the substrate is made of Si single crystal.

29. The ferroelectric thin film producing method as claimed in claim 24, wherein the substrate is made of an oxidized single crystal.

30. The ferroelectric thin film producing method as claimed in claim 29, wherein the oxidized single crystal is one selected from the group consisting of MgO, $Al_2O_3$ and $SrTiO_3$.

31. The ferroelectric thin film producing method as claimed in claim 24, wherein the substrate has a front surface on which the ferroelectric thin film is to be produced, the substrate being formed on the front surface with a film made of one selected from a group consisting of Pt, $SiO_2$, SiN and TiN.

32. The ferroelectric thin film producing method as claimed in claim 24, wherein the substrate has a front surface on which the ferroelectric thin film is to be produced, the substrate being formed on the front surface with a Si single crystal film.

33. The ferroelectric thin film producing method as claimed in claim 24, wherein the substrate has a front surface on which the ferroelectric thin film is to be produced, the substrate being formed on the front surface with an oxidized single crystal film.

34. The ferroelectric thin film producing method as claimed in claim 33, wherein the oxidized single crystal is one selected from the group consisting of MgO, $Al_2O_3$ and $SrTiO_3$.

35. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a PLZT layer structure having a stoichiometric composition given as $(Pb_{1-y}La_y)$ $(Zr_xTi_{1-x})_{1-y/4}O_3$ where $0<x<1$ and $0<y<1$ by introducing evaporated Ti source material into the reaction chamber via a first feed line to produce a first layer which is one of Ti and $TiO_2$ layers having a thickness, then, after formation of the first layer, introducing evaporated Pb source material into the reaction chamber via a second feed line to produce a second layer which is one of Pb and PbO layers having a thickness on said first layer, then introducing evaporated La source material into the reaction chamber via a third feed line to produce a third layer which is one of La and $La_2O_3$ layers having a thickness on said second layer, then, after formation of said third layer, introducing evaporated Zr source material into the reaction chamber via a fourth feed line to produce a fourth layer which is one of Zr and $ZrO_2$ layers having a thickness on said third layer, then, after formation of said fourth layer, introducing evaporated Pb source material into the reaction chamber via a fifth feed line to produce a fifth layer which is one of Pb and PbO layer having a thickness on said fourth layer, and, after formation of said fifth layer introducing evaporated La source material into the reaction chamber via a sixth feed line to produce a sixth layer which is one of La and $La_2O_3$ layers having a thickness on said fifth layer so as to produce a PLZT layer structure having said first, second, third, fourth, fifth and sixth layers the first, second, third, fourth, fifth and sixth feed lines separate from each other to avoid mixing or reaction of the evaporated source materials with each other prior to introduction into the reaction chamber; and (c) continuously repeating the sequence of the step (b) a number of times until a PLZT ferroelectric thin film having a plurality of said PLZT layer structures on the substrate is formed.

36. The ferroelectric thin film producing method as claimed in claim 35, wherein the Pb source material is $Pb(C_2H_5)_4$, the Zr source material is $Zr(t-OC_4H_9)_4$, the Ti source material is $Ti(i-OC_3H_7)_4$, and the La source material is $La(DPM)_3$.

37. The ferroelectric thin film producing method as claimed in claim 35, wherein the substrate is maintained at a temperature ranging from 350° C. to 750° C. during the step (b).

38. The ferroelectric thin film producing method as claimed in claim 35, wherein the substrate is made of one selected from the group consisting of Pt, $SiO_2$, SiN and TiN.

39. The ferroelectric thin film producing method as claimed in claim 35, wherein the substrate is made of Si single crystal.

40. The ferroelectric thin film producing method as claimed in claim 35, wherein the substrate is made of an oxidized single crystal.

41. The ferroelectric thin film producing method as claimed in claim 40, wherein the oxidized single crystal is one selected from the group consisting of MgO, $Al_2O_3$ and $SrTiO_3$.

42. The ferroelectric thin film producing method as claimed in claim 35, wherein the substrate has a front surface on which the ferroelectric thin film is to be produced, the substrate being formed on the front surface with a film made of one selected from the group consisting of Pt, $SiO_2$, SiN and TiN.

43. The ferroelectric thin film producing method as claimed in claim 35, wherein the substrate has a front surface on which the ferroelectric thin film is to be produced, the substrate being formed on the front surface with a Si single crystal film.

44. The ferroelectric thin film producing method as claimed in claim 35, wherein the substrate has a front surface on which the ferroelectric thin film is to be produced, the substrate being formed on the front surface with an oxidized single crystal film.

45. The ferroelectric thin film producing method as claimed in claim 44, wherein the oxided single crystal is one selected from the group consisting of MgO, $Al_2O_3$ and $SrTiO_3$.

46. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Ti source material into the reaction chamber via a first feed line to produce a first layer which is one of Ti and $TiO_2$ layers having a thickness, then, after formation of the first layer, introducing evaporated La source material into the reaction chamber via a second feed line to produce a second layer which is one of La and $La_2O_3$ layers having a thickness on said first layer, then introducing evaporated Pb source material into the reaction chamber via a third feed line to produce a third layer which is one of Pb and PbO layers having a thickness on said second layer, then, after formation of said third layer, introducing evaporated Zr source material into the reaction chamber via a fourth feed line to produce a fourth layer which is one of Zr and $ZrO_2$ layers having a thickness on said third layer, then, after formation of said fourth layer, introducing evaporated La source material into the reaction chamber via a fifth feed line to produce a fifth layer which is one of La and $La_2O_3$ layer having a thickness on said fourth layer, and, after formation of said fifth layer introducing evaporated Pb source material into the reaction chamber via a sixth feed line to produce a sixth layer which is one of Pb and PbO layers having a thickness on said fifth layer so as to produce a PLZT layer structure having said first, second, third, fourth, fifth and sixth layers the first, second, third, fourth, fifth and sixth feed lines separate from each other to avoid mixing or reaction of the evaporated source materials with each other prior to introduction into the reaction chamber; and (c) continuously repeating the sequence of the step (b) a number of times until a PLZT ferroelectric thin film having a plurality of said PLZT layer structures on the substrate is formed.

47. The ferroelectric thin film producing method as claimed in claim 46, wherein the Pb source material is $Pb(C_2H_5)_4$, the Zr source material is $Zr(t-OC_4H_9)_4$, the Ti source material is $Ti(i-OC_3H_7)_4$, and the La source material is $La(DPM)_3$.

48. The ferroelectric thin film producing method as claimed in claim 46, wherein the substrate is maintained at a temperature ranging from 350° C. to 750° C. during the step (b).

49. The ferroelectric thin film producing method as claimed in claim 46, wherein the substrate is made of one selected from the group consisting of Pt, $SiO_2$, SiN and TiN.

50. The ferroelectric thin film producing method as claimed in claim 46, wherein the substrate is made of Si single crystal.

51. The ferroelectric thin film producing method as claimed in claim 46, wherein the substrate is made of an oxidized single crystal.

52. The ferroelectric thin film producing method as claimed in claim 51, wherein the oxidized single crystal is one selected from a group consisting of MgO, $Al_2O_3$ and $SrTiO_3$.

53. The ferroelectric thin film producing method as claimed in claim 46, wherein the substrate has a front surface on which the ferroelectric thin film is to be produced, the substrate being formed on the front surface with a film made of one selected from the group consisting of Pt, $SiO_2$, SiN and TiN.

54. The ferroelectric thin film producing method as claimed in claim 46, wherein the substrate has a front surface on which the ferroelectric thin film is to be produced, the substrate being formed on the front surface with a Si single crystal film.

55. The ferroelectric thin film producing method as claimed in claim 46, wherein the substrate has a front surface one which the ferroelectric thin film is to be produced, the substrate being formed on the front surface with an oxidized single crystal film.

56. The ferroelectric thin film producing method as claimed in claim 55, wherein the oxidized single crystal is one selected from the group consisting of MgO, $Al_2O_3$ and $SrTiO_3$.

57. A method of producing a ferroelectric thin film on a substrate placed on a susceptor in a reaction chamber, comprising the steps of:
   (a) heating the substrate and introducing $O_2$ and/or $O_3$ gases into the reaction chamber to provide an oxygen gas atmosphere therein;
   (b) producing a PLZT layer structure having a stoichiometric composition given as $(Pb_{1-y}La_y)(Zr_xTi_{1-x})O_{1-y/4}O_3$ where $0<x<1$ and $0<y<1$ by introducing evaporated Ti source material into the reaction chamber via a first feed line to produce a first layer which is one of Ti and $TiO_2$ layers having a thickness, then, after formation of said first layer, introducing evaporated Zr source material into the reaction chamber via a second feed line to produce a second layer which is one of Zr and $ZrO_2$ layers having a thickness on said first layer, then, after formation of said second layer, introducing evaporated Pb source material into the reaction chamber via a third feed line to produce a third layer which is one of Pb and PbO layers having a thickness on said second layer, and, after formation of said third layer, introducing evaporated La source material into the reaction chamber via a fourth feed line to produce a fourth layer which is one of La and $La_2O_3$ layers having a thickness on said third layer so as to produce a PLZT layer structure having said first, second, third and fourth layers, the first, second, third and fourth feed lines separate from each other to avoid mixing or reaction of the evaporated source materials with each other prior to introduction into the reaction chamber; and
   (c) continuously repeating the sequence of the step (b) a number of times until a PLZT ferroelectric thin film having a plurality of said PLZT layer structures on the substrate is formed.

58. The ferroelectric thin film producing method as claimed in claim 57, wherein the Pb source material is $Pb(C_2H_5)_4$, the Zr source material is $Zr(t-OC_4H_9)_4$, the Ti source material is $Ti(i-OC_3H_7)_4$, and the La source material is $La(DPM)_3$.

59. The ferroelectric thin film producing method as claimed in claim 57, wherein the substrate is maintained at a temperature ranging from 350° C. to 750° C. during the step (b).

60. The ferroelectric thin film producing method as claimed in claim 57, wherein the substrate is made of one selected from the group consisting of Pt, $SiO_2$, SiN and TiN.

61. The ferroelectric thin film producing method as claimed in claim 57, wherein the substrate is made of Si single crystal.

62. The ferroelectric thin film producing method as claimed in claim 57, wherein the substrate is made of an oxidized single crystal.

63. The ferroelectric thin film producing method as claimed in claim 62, wherein the oxidized single crystal is one selected from the group consisting of MgO, $Al_2O_3$ and $SrTiO_3$.

64. The ferroelectric thin film producing method as claimed in claim 57, wherein the substrate has a front surface on which the ferroelectric thin film is to be produced, the substrate being formed on the front surface with a film made of one selected from the group consisting of Pt, $SiO_2$, SiN and TiN.

65. The ferroelectric thin film producing method as claimed in claim 57, wherein the substrate has a front surface on which the ferroelectric thin film is to be produced, the substrate being formed on the front surface with a Si single crystal film.

66. The ferroelectric thin film producing method as claimed in claim 57, wherein the substrate has a front surface on which the ferroelectric thin film is to be produced, the substrate being formed on the front surface with an oxidized single crystal film.

67. The ferroelectric thin film producing method as claimed in claim 66, wherein the oxidized single crystal is one selected from the group consisting of MgO, $Al_2O_3$ and $SrTiO_3$.

68. A method of producing a ferroelectric thin film on a substrate placed on a susceptor in a reaction chamber, comprising the steps of:
   (a) heating the substrate and introducing $O_2$ and/or $O_3$ gases into the reaction chamber to provide an oxygen gas atmosphere therein;
   (b) producing a PLZT layer structure having a stoichiometric composition given as $(Pb_{1-y}La_y)(Zr_xTi_{1-x})O_{1-y/4}O_3$ where $0<x<1$ and $0<y<1$ by introducing evaporated Ti source material into the reaction chamber via a first feed line to produce a first layer which is one of Ti and $TiO_2$ layers having a thickness, then, after formation of said first layer, introducing evaporated Zr source material into the reaction chamber via a second feed line to produce a second layer which is one of Zr and $ZrO_2$ layers having a thickness on said first layer, then, after formation of said second layer, introducing evaporated La source material into the reaction chamber via a third feed line to produce a third layer which is one of La and $La_2O_3$ layers having a thickness on said second layer, and, after formation of said third layer, introducing evaporated Pb source material into the reaction chamber via a fourth feed line to produce a fourth layer which is one of Pb and PbO layers having a thickness on said third layer so as to produce a PLZT layer structure having said first, second, third and fourth layers, the first, second, third and fourth feed lines separate from each other to avoid mixing or reaction of the evaporated source materials with each other prior to introduction into the reaction chamber; and
   (c) continuously repeating the sequence of the step (b) a number of times until a PLZT ferroelectric thin film having a plurality of said PLZT layer structures on the substrate is formed.

69. The ferroelectric thin film producing method as claimed in claim 68, wherein the Pb source material is $Pb(C_2H_5)_4$, the Zr source material is $Zr(t-OC_4H_9)_4$, the Ti source material is $Ti(i-OC_3H_7)_4$, and the La source material is $La(DPM)_3$.

70. The ferroelectric thin film producing method as claimed in claim 68, wherein the substrate is maintained at a temperature ranging from 350° C. to 750° C. during the step (b).

71. The ferroelectric thin film producing method as claimed in claim 68, wherein the substrate is made of one selected from the group consisting of Pt, $SiO_2$, SiN and TiN.

72. The ferroelectric thin film producing method as claimed in claim 68, wherein the substrate is made of Si single crystal.

73. The ferroelectric thin film producing method as claimed in claim 68, wherein the substrate is made of an oxidized single crystal.

74. The ferroelectric thin film producing method as claimed in claim 73, wherein the oxidized single crystal is one selected from the group consisting of MgO, $Al_2O_3$ and $SrTiO_3$.

75. The ferroelectric thin film producing method as claimed in claim 68, wherein the substrate has a front surface on which the ferroelectric thin film is to be produced, the substrate being formed on the front surface with a film made of one selected from the group consisting of Pt, $SiO_2$, SiN and TiN.

76. The ferroelectric thin film producing method as claimed in claim 68, wherein the substrate has a front surface on which the ferroelectric thin film is to be produced, the substrate being formed on the front surface with a Si single crystal film.

77. The ferroelectric thin film producing method as claimed in claim 68, wherein the substrate has a front surface on which the ferroelectric thin film is to be produced, the substrate being formed on the front surface with an oxidized single crystal film.

78. The ferroelectric thin film producing method as claimed in claim 77, wherein the oxidized single crystal is one selected from the group consisting of MgO, $Al_2O_3$ and $SrTiO_3$.

79. A method of producing a ferroelectric thin film on a substrate placed on a susceptor in a reaction chamber, comprising the steps of:
  (a) heating the substrate and introducing $O_2$ and/or $O_3$ gases into the reaction chamber to provide an oxygen gas atmosphere therein;
  (b) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Zr source material into the reaction chamber via a first feed line to produce a first layer which is one of Zr and $ZrO_2$ layers having a thickness, then, after formation of said first layer, introducing evaporated Ti source material into the reaction chamber via a second feed line to produce a second layer which is one of Ti and $TiO_2$ layers having a thickness on said first layer, then, after formation of said second layer, introducing evaporated Pb source material into the reaction chamber via a third feed line to produce a third layer which is one of Pb and PbO layers having a thickness on said second layer, and, after formation of said third layer, introducing evaporated La source material into the reaction chamber via a fourth feed line to produce a fourth layer which is one of La and $La_2O_3$ layers having a thickness on said third layer so as to produce a PLZT layer structure having said first, second, third and fourth layers, the first, second, third and fourth feed lines separate from each other to avoid mixing or reaction of the evaporated source materials with each other prior to introduction into the reaction chamber; and
  (c) continuously repeating the sequence of the step (b) a number of times until a PLZT ferroelectric thin film having a plurality of said PLZT layer structures on the substrate is formed.

80. The ferroelectric thin film producing method as claimed in claim 79, wherein the Pb source material is $Pb(C_2H_5)_4$, the Zr source material is $Zr(t-OC_4H_9)_4$, the Ti source material is $Ti(i-OC_3H_7)_4$, and the La source material is $La(DPM)_3$.

81. The ferroelectric thin film producing method as claimed in claim 79, wherein the substrate is maintained at a temperature ranging from 350° C. to 750° C. during the step (b).

82. The ferroelectric thin film producing method as claimed in claim 79, wherein the substrate is made of one selected from the group consisting of Pt, $SiO_2$, SiN and TiN.

83. The ferroelectric thin film producing method as claimed in claim 79, wherein the substrate is made of Si single crystal.

84. The ferroelectric thin film producing method as claimed in claim 79, wherein the substrate is made of an oxidized single crystal.

85. The ferroelectric thin film producing method as claimed in claim 84, wherein the oxidized single crystal is one selected from the group consisting of MgO, $Al_2O_3$ and $SrTiO_3$.

86. The ferroelectric thin film producing method as claimed in claim 79, wherein the substrate has a front surface on which the ferroelectric thin film is to be produced, the substrate being formed on the front surface with a film made of one selected from the group consisting of Pt, $SiO_2$, SiN and TiN.

87. The ferroelectric thin film producing method as claimed in claim 79, wherein the substrate has a front surface on which the ferroelectric thin film is to be produced, the substrate being formed on the front surface with a Si single crystal film.

88. The ferroelectric thin film producing method as claimed in claim 79, wherein the substrate has a front surface on which the ferroelectric thin film is to be produced, the substrate being formed on the front surface with an oxidized single crystal film.

89. The ferroelectric thin film producing method as claimed in claim 88, wherein the oxidized single crystal is one selected from the group consisting of MgO, $Al_2O_3$ and $SrTiO_3$.

90. A method of producing a ferroelectric thin film on a substrate placed on a susceptor in a reaction chamber, comprising the steps of:
  (a) heating the substrate and introducing $O_2$ and/or $O_3$ gases into the reaction chamber to provide an oxygen gas atmosphere therein;
  (b) producing a PLZT layer structure having a stoichiometric composition given as $(Pb_{1-y}La_y)(Zr_xTi_{1-x})O_{1-y/4}O_3$ where $0<x<1$ and $0<y<1$ by introducing evaporated Zr source material into the reaction chamber via a first feed line to produce a first layer which is one of Zr and $ZrO_2$ layers having a thickness, then, after formation of said first layer, introducing evaporated Ti source material into the reaction chamber via a second feed line to produce a second layer which is one of Ti and $TiO_2$ layers having a thickness on said first layer, then, after formation of said second layer, introducing evaporated La source material into the reaction chamber via a third feed line to produce a third layer which is one of La and $La_2O_3$ layers having a thickness on said second layer, and, after formation of said third layer, introducing evaporated Pb source material into the reaction chamber via a fourth feed line to produce a fourth layer which is one of Pb and PbO layers having a thickness on said third laygr so as to produce a PLZT layer structure having said first, second, third and fourth layers, the first, second, third and fourth feed lines separate from each other to avoid mixing or reaction of the evaporated source materials with each other prior to introduction into the reaction chamber; and
  (c) continuously repeating the sequence of the step (b) a number of times until a PLZT ferroelectric thin film having a plurality of said PLZT layer structures on the substrate is formed.

91. The ferroelectric thin film producing method as claimed in claim 90, wherein the Pb source material is $Pb(C_2H_5)_4$, the Zr source material is $Zr(t-OC_4H_9)_4$, the Ti source material is $Ti(i-OC_3H_7)_4$, and the La source material is $La(DPM)_3$.

92. The ferroelectric thin film producing method as claimed in claim 90, wherein the substrate is maintained at a temperature ranging from 350° C. to 750° C. during the step (b).

93. The ferroelectric thin film producing method as claimed in claim 90, wherein the substrate is made of one selected from the group consisting of Pt, $SiO_2$, SiN and TiN.

94. The ferroelectric thin film producing method as claimed in claim 90, wherein the substrate is made of Si single crystal.

95. The ferroelectric thin film producing method as claimed in claim 90, wherein the substrate is made of an oxidized single crystal.

96. The ferroelectric thin film producing method as claimed in claim 95, wherein the oxidized single crystal is one selected from the group consisting of MgO, $Al_2O_3$ and $SrTiO_3$.

97. The ferroelectric thin film producing method as claimed in claim 90, wherein the substrate has a front surface on which the ferroelectric thin film is to be produced, the substrate being formed on the front surface with a film made of one selected from the group consisting of Pt, $SiO_2$, SiN and TiN.

98. The ferroelectric thin film producing method as claimed in claim 90, wherein the substrate has a front surface on which the ferroelectric thin film is to be produced, the substrate being formed on the front surface with a Si single crystal film.

99. The ferroelectric thin film producing method as claimed in claim 90, wherein the substrate has a front surface on which the ferroelectric thin film is to be produced, the substrate being formed on the front surface with an oxidized single crystal film.

100. The ferroelectric thin film producing method as claimed in claim 99, wherein the oxidized single crystal is one selected from the group consisting of MgO, $Al_2O_3$ and $SrTiO_3$.

101. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a $PbTiO_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a $PbTiO_3$ layer structure having the first and second layers;

(c) repeating the sequence of the step (b) a number of times until a $PbTiO_3$ film having a plurality of said $PbTiO_3$ layer structures piled on the substrate is formed;

(d) producing a PZT layer structure having a stoichiometric composition given as $(Pb)(Zr_xTi_{1-x})O_3$ where $0<x<1$ by introducing evaporated Ti source material into the reaction chamber via a third feed line to produce a third layer which is one of the Ti and $TiO_2$ layers having a thickness on said plurality of $PbTiO_3$ layer structures, then, after formation of said third layer, introducing evaporated Pb source material into the reaction chamber via a fourth feed line to produce a fourth layer which is one of Pb and PbO layers having a thickness on said third layer, then, after formation of said fourth layer, introducing evaporated Zr source material into the reaction chamber via a fifth feed line to produce a fifth layer which is one of Zr and $ZrO_2$ layers having a thickness on said fourth layer, then, after formation of said fifth layer, introducing evaporated Pb source material into the reaction chamber via a sixth feed line to produce a sixth layer which is one of Pb and PbO layers having a thickness on said fifth layer so as to produce a PZT layer structure having said third, fourth, fifth and sixth layers, all feed lines being separate from each to avoid mixing or reaction of the evaporated source material prior to introduction to the reaction chamber; and (e) repeating the sequence of the step (d) a number of times until the PZT ferroelectric thin film having a plurality of said PZT layer structures piled on the $PbTiO_3$ film is formed.

102. The ferroelectric thin film producing method as claimed in claim 101, wherein the Pb source material is $Pb(C_2H_5)_4$, the Zr source material is $Zr(t-OC_4H_9)_4$, and the Ti source material is $Ti(i-OC_3H_7)_4$.

103. The ferroelectric thin film producing method as claimed in claim 101, wherein the substrate is maintained at a temperature ranging from 350° C. to 750° C. during the step (b).

104. The ferroelectric thin film producing method as claimed in claim 101, wherein the substrate is made of one selected from the group consisting of Pt, $SiO_2$, SiN and TiN.

105. The ferroelectric thin film producing method as claimed in claim 101, wherein the substrate is made of Si single crystal.

106. The ferroelectric thin film producing method as claimed in claim 101, wherein the substrate is made of an oxidized single crystal.

107. The ferroelectric thin film producing method as claimed in claim 106, wherein the oxidized single crystal is one selected from the group consisting of MgO, $Al_2O_3$ and $SrTiO_3$.

108. The ferroelectric thin film producing method as claimed in claim 101, wherein the substrate has a front surface on which the ferroelectric thin film is to be produced, the substrate being formed on the front surface with a film made of one selected from the group consisting of Pt, $SiO_2$, SiN and TiN.

109. The ferroelectric thin film producing method as claimed in claim 101, wherein the substrate has a front surface on which the ferroelectric thin film is to be produced, the substrate being formed on the front surface with a Si single crystal film.

110. The ferroelectric thin film producing method as claimed in claim 101, wherein the substrate has a front surface on which the ferroelectric thin film is to be produced, the substrate being formed on the front surface with an oxidized single crystal film.

111. The ferroelectric thin film producing method as claimed in claim 110, wherein the oxidized single crystal is one selected from the group consisting of MgO, $Al_2O_3$ and $SrTiO_3$.

112. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a $PbTiO_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) repeating the sequence of the step (b) a number of times until a PbTiO$_3$ film having a plurality of said PbTiO$_3$ layer structures piled on the substrate is formed;

(d) producing a PZT layer structure having a stoichiometric composition given as (Pb)(Zr$_x$Ti$_{1-x}$)O$_3$ where 0<x<1 by introducing evaporated Ti source material into the reaction chamber via a third feed line to produce a third layer which is one of the Ti and TiO$_2$ layers having a thickness on said plurality of PbTiO$_3$ layer structures, then, after formation of said third layer, introducing evaporated Zr source material into the reaction chamber via a fourth feed line to produce a fourth layer which is one of Zr and ZrO$_2$ layers having a thickness on said third layer, then, after formation of said fourth layer, introducing evaporated Pb source material into the reaction chamber via a fifth feed line to produce a fifth layer which is one of Pb and PbO layers having a thickness on said fourth layer so as to produce a PZT layer structure having said third, fourth and fifth layers, all feed lines being separate from each to avoid mixing or reaction of the evaporated source material prior to introduction to the reaction chamber; and (e) repeating the sequence of the step (d) a number of times until the PZT ferroelectric thin film having a plurality of said PZT layer structures piled on the PbTiO$_3$ film is formed.

113. The ferroelectric thin film producing method as claimed in claim 112, wherein the Pb source material is Pb(C$_2$H$_5$)$_4$, the Zr source material is Zr(t-OC$_4$H$_9$)$_4$, and the Ti source material is Ti(i-OC$_3$H$_7$)$_4$.

114. The ferroelectric thin film producing method as claimed in claim 112, wherein the substrate is maintained at a temperature ranging from 350° C. to 750° C. during the step (b).

115. The ferroelectric thin film producing method as claimed in claim 112, wherein the substrate is made of one selected from the group consisting of Pt, SiO$_2$, SiN and TiN.

116. The ferroelectric thin film producing method as claimed in claim 112, wherein the substrate is made of Si single crystal.

117. The ferroelectric thin film producing method as claimed in claim in 112, wherein the substrate is made of an oxidized single crystal.

118. The ferroelectric thin film producing method as claimed in claim 117, wherein the oxidized single crystal is one selected from the group consisting of MgO, Al$_2$O$_3$ and SrTiO$_3$.

119. The ferroelectric thin film producing method as claimed in claim 112, wherein the substrate has a front surface on which the ferroelectric thin film is to be produced, the substrate being formed on the front surface with a film made of one selected from the group consisting of Pt, SiO$_2$, SiN and TiN.

120. The ferroelectric thin film producing method as claimed in claim 112, wherein the substrate has a front surface on which the ferroelectric thin film is to be produced, the substrate being formed on the front surface with a Si single crystal film.

121. The ferroelectric thin film producing method as claimed in claim 112, wherein the substrate has a front surface on which the ferroelectric thin film is to be produced, the substrate being formed on the front surface with an oxidized single crystal film.

122. The ferroelectric thin film producing method as claimed in claim 121, wherein the oxidized single crystal is one selected from the group consisting of MgO, Al$_2$O$_3$ and SrTiO$_3$.

123. A method of producing a ferroelectric thin film on a substrate placed in a reaction chamber, comprising the steps of:

(a) heating the substrate and introducing O$_2$ and/or O$_3$ gases into the reaction chamber to provide an oxygen gas atmosphere therein;

(b) producing a PbTiO$_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) repeating the sequence of the step (b) a number of times until a PbTiO$_3$ film having a plurality of said PbTiO$_3$ layer structures piled on the substrate is formed;

(d) producing a PZT layer structure having a stoichiometric composition given as (Pb) (Zr$_x$Ti$_{1-x}$)O$_3$ where 0<x<1 by introducing evaporated Zr source material into the reaction chamber via a third feed line to produce a third layer which is one of the Zr and ZrO$_2$ layers having a thickness on said plurality of PbTiO$_3$ layers structure, then, after formation of said third layer, introducing evaporated Ti source material into the reaction chamber via a fourth feed line to produce a fourth layer which is one of Ti and TiO$_2$ layers having a thickness on said third layer, then, after formation of said fourth layer, introducing evaporated Pb source material into the reaction chamber via a fifth feed line to produce a fifth layer which is one of Pb and PbO layers having a thickness on said fourth layer so as to produce a PZT layer structure having said third, fourth and fifth layers, all feed lines being separate from each to avoid mixing or reaction of the evaporated source material prior to introduction to the reaction chamber; and (e) repeating the sequence of the step (d) a number of times until the PZT ferroelectric thin film having a plurality of said PZT layer structures piled on the PbTiO$_3$ plurality of said PZT layer structures piled on the PBTiO$_3$ film is formed.

124. The ferroelectric thin film producing method as claimed in claim 123, wherein the Pb source material is Pb(C$_2$H$_5$)$_4$, the Zr source material is Zr(t-OC$_4$H$_9$)$_4$, and the Ti source material is Ti(i-OC$_3$H$_7$)$_4$.

125. The ferroelectric thin film producing method as claimed in claim 123, wherein the substrate is maintained at a temperature ranging from 350° C. to 750° C. during the step (b).

126. The ferroelectric thin film producing method as claimed in claim 123, wherein the substrate is made of one selected from the group consisting of Pt, SiO$_2$, SiN and TiN.

127. The ferroelectric thin film producing method as claimed in claim 123, wherein the substrate is made of Si single crystal.

128. The ferroelectric thin film producing method as claimed in claim 123, wherein the substrate is made of an oxidized single crystal.

129. The ferroelectric thin film producing method as claimed in claim 128, wherein the oxidized single crystal is one selected from the group consisting of MgO, $Al_2O_3$ and $SrTiO_3$.

130. The ferroelectric thin film producing method as claimed in claim 123, wherein the substrate has a front surface on which the ferroelectric thin film is to be produced, the substrate being formed on the front surface with a film made of one selected from the group consisting of Pt, $SiO_2$, SiN and TiN.

131. The ferroelectric thin film producing method as claimed in claim 123, wherein the substrate has a front surface on which the ferroelectric thin film is to be produced, the substrate being formed on the front surface with a Si single crystal film.

132. The ferroelectric thin film producing method as claimed in claim 123, wherein the substrate has a front surface on which the ferroelectric thin film is to be produced, the substrate being formed on the front surface with an oxidized single crystal film.

133. The ferroelectric thin film producing method as claimed in claim 132, wherein the oxidized single crystal is one selected from the group consisting of MgO, $Al_2O_3$ and $SrTiO_3$.

134. A method of producing a ferroelectric thin film on a substrate placed in a reaction chamber, comprising the steps of:

(a) introducing $O_2$ and/or $O_3$ gases into the reaction chamber to provide an oxygen gas atmosphere therein;

(b) producing a $PbTiO_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a $PbTiO_3$ layer structure having the first and second layers;

(c) repeating the sequence of the step (b) a number of times until a $PbTiO_3$ film having a plurality of said $PbTiO_3$ layer structures piled on the substrate is formed;

(d) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Ti source material into the reaction chamber via a third feed line to produce a third layer which is one of the Ti and $TiO_2$ layers having a thickness on said plurality of $PbTiO_3$ layer structures, then, after formation of said third layer, introducing evaporated Pb source material into the reaction chamber via a fourth feed line to produce a fourth layer which is one of Pb and PbO layers having a thickness on said third layer, then, after formation of said fourth layer, introducing evaporated La source material into the reaction chamber via a fifth feed line to produce a fifth layer which is one of La and $La_2O_3$ layers having a thickness on said fourth layer, then, after formation of said fifth layer, introducing evaporated Zr source material into the reaction chamber via a sixth feed line to produce a sixth layer which is one of Zr and $ZrO_2$ layers having a thickness on said fifth layer, then, after formation of said sixth layer, introducing evaporated Pb source material into the reaction chamber via a seventh feed line to produce a seventh layer which is one of Pb and PbO layers having a thickness or said sixth layer, and, after formation of said seventh layer, introducing evaporated La source material into the reaction chamber to produce an eighth layer which is one of La and $La_2O_3$ layers having a thickness on said seventh layer so as to produce a PLZT layer structure having third, fourth, fifth, sixth, seventh and eighth layers piled in this order, all feed lines being separate from each to avoid mixing or reaction of the evaporated source material prior to introduction to the reaction chamber; and (e) repeating the sequence of the step (d) a number of times until the PLZT ferroelectric thin film having a plurality of said PLZT layer structures piled on the $PbTiO_3$ film is formed.

135. The ferroelectric thin film producing method as claimed in claim 134, wherein the Pb source material is $Pb(C_2H_5)_4$, the Zr source material is $Zr(t—OC_4H_9)_4$, the Ti source material is $Ti(i—OC_3H_7)_4$, and the La source material is $La\ (DPM)_3$.

136. The ferroelectric thin film producing method as claimed in claim 134, wherein the substrate is maintained at a temperature ranging from 350° C. to 750 ° C. during the step (b).

137. The ferroelectric thin film producing method as claimed in claim 134, wherein the substrate is made of one selected from the group consisting of Pt, $SiO_2$, SiN and TiN.

138. The ferroelectric thin film producing method as claimed in claim 134, wherein the substrate is made of Si single crystal.

139. The ferroelectric thin film producing method as claimed in claim 134, wherein the substrate is made of an oxidized single crystal.

140. The ferroelectric thin film producing method as claimed in claim 139, wherein the oxided single crystal is one selected from the group consisting of MgO, $Al_2O_3$ and $SrTiO_3$.

141. The ferroelectric thin film producing method as claimed in claim 134, wherein the substrate has a front surface on which the ferroelectric thin film is to be produced, the substrate being formed on the front surface with a film made of one selected from the group consisting of Pt, $SiO_2$, SiN and TiN.

142. The ferroelectric thin film producing method as claimed in claim 134, wherein the substrate has a front surface on which the ferroelectric thin film is to be produced, the substrate being formed on the front surface with a Si single crystal film.

143. The ferroelectric thin film producing method as claimed in claim 134, wherein the substrate has a front surface on which the ferroelectric thin film is to be produced, the substrate being formed on the front surface with an oxidized single crystal film.

144. The ferroelectric thin film producing method as claimed in claim 143, wherein the oxidized single crystal is one selected from the group consisting of MgO, $Al_2O_3$ and $SrTiO_3$.

145. The method of claim 134, further comprising the step of, during the producing steps (b) and (d), discharging one evaporated source material from in the reaction chamber prior to introducing a subsequent evaporated source material.

146. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a $PbTiO_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) repeating the sequence of the step (b) a number of times until a PbTiO$_3$ film having a plurality of said PbTiO$_3$ layer structures piled on the substrate is formed;

(d) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Ti source material into the reaction chamber via a third feed line to produce a third layer which is one of the Ti and TiO$_2$ layers having a thickness on said plurality of PbTiO$_3$ layer structures, then, after formation of said third layer, introducing evaporated La source material into the reaction chamber via a fourth feed line to produce a fourth layer which is one of La and La$_2$O$_3$ layers having a thickness on said third layer, then, after formation of said fourth layer, introducing evaporated Pb source material into the reaction chamber via a fifth feed line to produce a fifth layer which is one of Pb and PbO layers having a thickness on said fourth layer, then, after formation of said fifth layer, introducing evaporated Zr source material into the reaction chamber via a sixth feed line to produce a sixth layer which is one of Zr and ZrO$_2$ layers having a thickness on said fifth layer, then, after formation of said sixth layer, introducing evaporated La source material into the reaction chamber via a seventh feed line to produce a seventh layer which is one of La and La$_2$O$_3$ layers having a thickness or said sixth layer, and, after formation of said seventh layer, introducing evaporated Pb source material into the reaction chamber via an eighth feed line to produce an eighth layer which is one of Pb and PbO layers having a thickness on said seventh layer so as to produce a PLZT layer structure having said third, fourth, fifth, sixth, seventh and eighth layers, all feed lines being separate from each to avoid mixing or reaction of the evaporated source material prior to introduction to the reaction chamber; and (e) repeating the sequence of the step (d) a number of times until the PLZT ferroelectric thin film having a plurality of said PLZT layer structures piled on the PbTiO$_3$ film is formed.

147. The ferroelectric thin film producing method as claimed in claim 146, wherein the Pb source material is Pb(C$_2$H$_5$)$_4$, the Zr source material is Zr(t—OC$_4$H$_9$)$_4$, the Ti source material is Ti(i—OC$_3$H$_7$)$_4$, and the La source material is La (DPM)$_3$.

148. The ferroelectric thin film producing method as claimed in claim 146, wherein the substrate is maintained at a temperature ranging from 350° C. to 750 ° C. during the step (b).

149. The ferroelectric thin film producing method as claimed in claim 146, wherein the substrate is made of one selected from the group consisting of Pt, SiO$_2$, SiN and TiN.

150. The ferroelectric thin film producing method as claimed in claim 146, wherein the substrate is made of Si single crystal.

151. The ferroelectric thin film producing method as claimed in claim 146, wherein the substrate is made of an oxidized single crystal.

152. The ferroelectric thin film producing method as claimed in claim 151, wherein the oxidized single crystal is one selected from the group consisting of MgO, Al$_2$O$_3$ and SrTiO$_3$.

153. The ferroelectric thin film producing method as claimed in claim 146, wherein the substrate has a front surface on which the ferroelectric thin film is to be produced, the substrate being formed on the front surface with a film made of one selected from the group consisting of Pt, SiO$_2$, SiN and TiN.

154. The ferroelectric thin film producing method as claimed in claim 146, wherein the substrate has a front surface on which the ferroelectric thin film is to be produced, the substrate being formed on the front surface with a Si single crystal film.

155. The ferroelectric thin film producing method as claimed in claim 146, wherein the substrate has a front surface on which the ferroelectric thin film is to be produced, the substrate being formed on the front surface with an oxidized single crystal film.

156. The ferroelectric thin film producing method as claimed in claim 155, wherein the oxided single crystal is one selected from the group consisting of MgO, Al$_2$O$_3$ and SrTiO$_3$.

157. A method of producing a ferroelectric thin film on a substrate placed in a reaction chamber, comprising the steps of:

(a) heating the substrate and introducing O$_2$ and/or O$_3$ gases into the reaction chamber to provide an oxygen gas atmosphere therein;

(b) producing a PbTiO$_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) repeating the sequence of the step (b) a number of times until a PbTiO$_3$ film having a plurality of said PbTiO$_3$ layer structures piled on the substrate is formed;

(d) producing a PLZT layer structure having a stoichiometric composition given as (Pb$_{1-y}$La$_y$)(Zr$_x$Ti$_{1-y/4}$)O$_3$ where 0<x<1 and 0<y<1 by introducing evaporated Ti source material into the reaction chamber via a third feed line to produce a third layer which is one of the Ti and TiO$_2$ layers having a thickness on said plurality of PbTiO$_3$ layer structures, then, after formation of said third layer, introducing evaporated Zr source material into the reaction chamber via a fourth feed line to produce a fourth layer which is one of Zr and ZrO$_2$ layers having a thickness on said third layer, then, after formation of said fourth layer, introducing evaporated Pb source material into the reaction chamber via a fifth feed line to produce a fifth layer which is one of Pb and PbO layers having a thickness on said fourth layer, then, after formation of said fifth layer, introducing evaporated La source material into the reaction chamber via a sixth feed line to produce a sixth layer which is one of La and La$_2$O$_3$ layers having a thickness on said fifth layer so as to produce a PLZT layer structure having said third, fourth, fifth and sixth layers, all feed lines being separate from each to avoid mixing or reaction of the evaporated source material prior to introduction to the reaction chamber; and (e) repeating the sequence of the step (d) a number of times until the PLZT ferroelectric thin film having a plurality of said PLZT layer structures piled on the PbTiO$_3$ film is formed.

158. The ferroelectric thin film producing method as claimed in claim 157, wherein the Pb source material is Pb(C$_2$H$_5$)$_4$, the Zr source material is Zr(t—OC$_4$H$_9$)$_4$, the Ti source material is Ti(i—OC$_3$H$_7$)$_4$, and the La source material is La(DPM)$_3$.

159. The ferroelectric thin film producing method as claimed in claim 157, wherein the substrate is maintained at a temperature ranging from 350° C. to 750° C. during the step (b).

160. The ferroelectric thin film producing method as claimed in claim 157, wherein the substrate is made of one selected from the group consisting of Pt, SiO$_2$, SiN and TiN.

161. The ferroelectric thin film producing method as claimed in claim 157, wherein the substrate is made of Si single crystal.

162. The ferroelectric thin film producing method as claimed in claim 157, wherein the substrate is made of an oxidized single crystal.

163. The ferroelectric thin film producing method as claimed in claim 162, wherein the oxidized single crystal is one selected from the group consisting of MgO, Al$_2$O$_3$ and SrTiO$_3$.

164. The ferroelectric thin film producing method as claimed in claim 157, wherein the substrate has a front surface on which the ferroelectric thin film is to be produced, the substrate being formed on the front surface with a film made of one selected from the group consisting of Pt, SiO$_2$, SiN and TiN.

165. The ferroelectric thin film producing method as claimed in claim 157, wherein the substrate has a front surface on which the ferroelectric thin film is to be produced, the substrate being formed on the front surface with a Si single crystal film.

166. The ferroelectric thin film producing method as claimed in claim 157, wherein the substrate has a front surface on which the ferroelectric thin film is to be produced, the substrate being formed on the front surface with an oxidized single crystal film.

167. The ferroelectric thin film producing method as claimed in claim 166, wherein the oxided single crystal is one selected from the group consisting of MgO, Al$_2$O$_3$ and SrTiO$_3$.

168. A method of producing a ferroelectric thin film on a substrate placed in a reaction chamber, comprising the steps of:

(a) heating the substrate and introducing O$_2$ and/or O$_3$ gases into the reaction chamber to provide an oxygen gas atmosphere therein;

(b) producing a PbTiO$_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) repeating the sequence of the step (b) a number of times until a PbTiO$_3$ film having a plurality of said PbTiO$_3$ layer structures piled on the substrate is formed;

(d) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Ti source material into the reaction chamber via a third feed line to produce a third layer which is one of the Ti and TiO$_2$ layers having a thickness on said plurality of PbTiO$_3$ layer structures, then, after formation of said third layer, introducing evaporated Zr source material into the reaction chamber via a fourth feed line to produce a fourth layer which is one of Zr and ZrO$_2$ layers having a thickness on said third layer, then, after formation of said fourth layer, introducing evaporated La source material into the reaction chamber via a fifth feed line to produce a fifth layer which is one of La and La$_2$O$_3$ layers having a thickness on said fourth layer, then, after formation of said fifth layer, introducing evaporated Pb source material into the reaction chamber via a sixth feed line to produce a sixth layer which is one of Pb and PbO layers having a thickness on said fifth layer so as to produce a PLZT layer structure having said third, fourth, fifth and sixth layers, all feed lines being separate from each to avoid mixing or reaction of the evaporated source material prior to introduction to the reaction chamber; and (e) repeating the sequence of the step (d) a number of times until the PLZT ferroelectric thin film having a plurality of said PLZT layer structures piled on the PbTiO$_3$ film is formed.

169. The ferroelectric thin film producing method as claimed in claim 168, wherein the Pb source material is Pb(C$_2$H$_5$)$_4$, the Zr source material is Zr(t—OC$_4$H$_9$)$_4$, the Ti source material is Ti(i—OC$_3$H$_7$)$_4$, and the La source material is La(DPM)$_3$.

170. The ferroelectric thin film producing method as claimed in claim 168, wherein the substrate is maintained at a temperature ranging from 350° C. to 750° C. during the step (b).

171. The ferroelectric thin film producing method as claimed in claim 168, wherein the substrate is made of one selected from the group consisting of Pt, SiO$_2$, SiN and TiN.

172. The ferroelectric thin film producing method as claimed in claim 168, wherein the substrate is made of Si single crystal.

173. The ferroelectric thin film producing method as claimed in claim 168, wherein the substrate is made of an oxidized single crystal.

174. The ferroelectric thin film producing method as claimed in claim 173, wherein the oxidized single crystal is one selected from the group consisting of MgO, Al$_2$O$_3$ and SrTiO$_3$.

175. The ferroelectric thin film producing method as claimed in claim 168, wherein the substrate has a front surface on which the ferroelectric thin film is to be produced, the substrate being formed on the front surface with a film made of one selected from the group consisting of Pt, SiO$_2$, SiN and TiN.

176. The ferroelectric thin film producing method as claimed in claim 168, wherein the substrate has a front surface on which the ferroelectric thin film is to be produced, the substrate being formed on the front surface with a Si single crystal film.

177. The ferroelectric thin film producing method as claimed in claim 168, wherein the substrate has a front surface on which the ferroelectric thin film is to be produced, the substrate being formed on the front surface with an oxidized single crystal film.

178. The ferroelectric thin film producing method as claimed in claim 177, wherein the oxidized single crystal is one selected from the group consisting of MgO, Al$_2$O$_3$ and SrTiO$_3$.

179. A method of producing a ferroelectric thin film on a substrate placed in a reaction chamber, comprising the steps of:

(a) heating the substrate and introducing O$_2$ and/or O$_3$ gases into the reaction chamber to provide an oxygen gas atmosphere therein;

(b) producing a PbTiO$_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) repeating the sequence of the step (b) a number of times until a PbTiO$_3$ film having a plurality of said PbTiO$_3$ layer structures piled on the substrate is formed;

(d) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Zr source material into the reaction chamber via a third feed line to produce a third layer which is one of the Zr and ZrO$_2$ layers having a thickness on said plurality of PbTiO$_3$ layer structures, then, after formation of said third layer, introducing evaporated Ti source material into the reaction chamber via a fourth feed line to produce a fourth layer which is one of Ti and TiO$_2$ layers having a thickness on said third layer, then, after formation of said fourth layer, introducing evaporated Pb source material into the reaction chamber via a fifth feed line to produce a fifth layer which is one of Pb and PbO layers having a thickness on said fourth layer, then, after formation of said fifth layer, introducing evaporated La source material into the reaction chamber via a sixth feed line to produce a sixth layer which is one of La and La$_2$O$_3$ layers having a thickness on said fifth layer so as to produce a PLZT layer structure having said third, fourth, fifth and sixth layers, all feed lines being separate from each to avoid mixing or reaction of the evaporated source material prior to introduction to the reaction chamber; and (e) repeating the sequence of the step (d) a number of times until the PLZT ferroelectric thin film having a plurality of said PLZT layer structures piled on the PbTiO$_3$ film is formed.

180. The ferroelectric thin film producing method as claimed in claim 175, wherein the Pb source material is Pb(C$_2$H$_5$)$_4$, the Zr source material is Zr(t—OC$_4$H$_9$)$_4$, the Ti source material is Ti(i—OC$_3$H$_7$)$_4$, and the La source material is La(DPM)$_3$.

181. The ferroelectric thin film producing method as claimed in claim 175, wherein the substrate is maintained at a temperature ranging from 350° C. to 750° C. during the step (b).

182. The ferroelectric thin film producing method as claimed in claim 175, wherein the substrate is made of one selected from the group consisting of Pt, SiO$_2$, SiN and TiN.

183. The ferroelectric thin film producing method as claimed in claim 175, wherein the substrate is made of Si single crystal.

184. The ferroelectric thin film producing method as claimed in claim 175, wherein the substrate is made of an oxidized single crystal.

185. The ferroelectric thin film producing method as claimed in claim 184, wherein the oxidized single crystal is one selected from the group consisting of MgO, Al$_2$O$_3$ and SrTiO$_3$.

186. The ferroelectric thin film producing method as claimed in claim 179, wherein the substrate has a front surface on which the ferroelectric thin film is to be produced, the substrate being formed on the front surface with a film made of one selected from the group consisting of Pt, SiO$_2$, SiN and TiN.

187. The ferroelectric thin film producing method as claimed in claim 179, wherein the substrate has a front surface on which the ferroelectric thin film is to be produced, the substrate being formed on the front surface with a Si single crystal film.

188. The ferroelectric thin film producing method as claimed in claim 179, wherein the substrate has a front surface on which the ferroelectric thin film is to be produced, the substrate being formed on the front surface with an oxidized single crystal film.

189. The ferroelectric thin film producing method as claimed in claim 188, wherein the oxidized single crystal is one selected from the group consisting of MgO, Al$_2$O$_3$ and SrTiO$_3$.

190. A method of producing a ferroelectric thin film on a substrate placed in a reaction chamber, comprising the steps of:

(a) heating the substrate and introducing O$_2$ and/or O$_3$ gases into the reaction chamber to provide an oxygen gas atmosphere therein;

(b) producing a PbTiO$_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) repeating the sequence of the step (b) a number of times until a PbTiO$_3$ film having a plurality of said PbTiO$_3$ layer structures piled on the substrate is formed;

(d) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Zr source material into the reaction chamber via a third feed line to produce a third layer which is one of the Zr and ZrO$_2$ layers having a thickness on said plurality of PbTiO$_3$ layer structures, then, after formation of said third layer, introducing evaporated Ti source material into the reaction chamber via a fourth feed line to produce a fourth layer which is one of Ti and TiO$_2$ layers having a thickness on said third layer, then, after formation of said fourth layer, introducing evaporated La source material into the reaction chamber via a fifth feed line to produce a fifth layer which is one of La and La$_2$O$_3$ layers having a thickness on said fourth layer, then, after formation of said fifth layer, introducing evaporated Pb source material into the reaction chamber via a sixth feed line to produce a sixth layer which is one of Pb and PbO layers having a thickness on said fifth layer so as to produce a PLZT layer structure having said third, fourth, fifth and sixth layers, all feed lines being separate from each to avoid mixing or reaction of the evaporated source material prior to introduction to the reaction chamber; and (e) repeating the sequence of the step (d) a number of times until the PLZT ferroelectric thin film having a plurality of said PLZT layer structures piled on the PbTiO$_3$ film is formed.

191. The ferroelectric thin film producing method as claimed in claim 190, wherein the Pb source material is Pb(C$_2$H$_5$)$_4$, the Zr source material is Zr(t—OC$_4$H$_9$)$_4$, the Ti source material is Ti(i—OC$_3$H$_7$)$_4$, and the La source material is La(DPM)$_3$.

192. The ferroelectric thin film producing method as claimed in claim 190, wherein the substrate is maintained at a temperature ranging from 350° C. to 750° C. during the step (b).

193. The ferroelectric thin film producing method as claimed in claim 190, wherein the substrate is made of one selected from the group consisting of Pt, $SiO_2$, SiN and TiN.

194. The ferroelectric thin film producing method as claimed in claim 190, wherein the substrate is made of Si single crystal.

195. The ferroelectric thin film producing method as claimed in claim 190, wherein the substrate is made of an oxidized single crystal.

196. The ferroelectric thin film producing method as claimed in claim 195, wherein the oxidized single crystal is one selected from the group consisting of MgO, $Al_2O_3$ and $SrTiO_3$.

197. The ferroelectric thin film producing method as claimed in claim 190, wherein the substrate has a front surface on which the ferroelectric thin film is to be produced, the substrate being formed on the front surface with a film made of one selected from the group consisting of Pt, $SiO_2$, SiN and TiN.

198. The ferroelectric thin film producing method as claimed in claim 190, wherein the substrate has a front surface on which the ferroelectric thin film is to be produced, the substrate being formed on the front surface with a Si single crystal film.

199. The ferroelectric thin film producing method as claimed in claim 190, wherein the substrate has a front surface on which the ferroelectric thin film is to be produced, the substrate being formed on the front surface with an oxidized single crystal film.

200. The ferroelectric thin film producing method as claimed in claim 199, wherein the oxided single crystal is one selected from the group consisting of MgO, $Al_2O_3$ and $SrTiO_3$.

201. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a $PbTiO_3$ layer structure by introducing evaporated Ti source material into the reaction chamber via a first feed line to produce a first layer and, after formation of said first layer, then introducing evaporated Pb source material into the reaction chamber via a second feed line to produce a second layer oh said first layer so as to produce a $PbTiO_3$ layer structure having the first and second layers;

(c) repeating the sequence of the step (b) a number of times until a $PbTiO_3$ film having a plurality of said $PbTiO_3$ layer structures piled on the substrate is formed;

(d) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Ti source material into the reaction chamber via a third feed line to produce a third layer which is one of the Ti and $TiO_2$ layers having a thickness on said plurality of $PbTiO_3$ layer structures, then, after formation of said third layer, introducing evaporated Pb source material into the reaction chamber via a fourth feed line to produce a fourth layer which is one of Pb and PbO layers having a thickness on said third layer, then, after formation of said fourth layer, introducing evaporated Zr source material into the reaction chamber via a fifth feed line to produce a fifth layer which is one of Zr and $ZrO_2$ layers having a thickness on said fourth layer, then, after formation of said fifth layer, introducing evaporated Pb source material into the reaction chamber via a sixth feed line to produce a sixth layer which is one of Pb and PbO layers having a thickness on said fifth layer so as to produce a PLZT layer structure having said third, fourth, fifth and sixth layers, all feed lines being separate from each to avoid mixing or reaction of the evaporated source material prior to introduction to the reaction chamber; and (e) repeating the sequence of the step (d) a number of times until the PLZT ferroelectric thin film having a plurality of said PLZT layer structures piled on the $PbTiO_3$ film is formed.

202. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a $PbTiO_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a $PbTiO_3$ layer structure having the first and second layers;

(c) producing a PZT layer structure having a stoichiometric composition given as $(Pb)(Zr_xTi_{1-x})O_3$ where $0<x<1$ by introducing evaporated Ti source material into the reaction chamber via a third feed line to produce a third layer which is one of the Ti and $TiO_2$ layers having a thickness on said $PbTiO_3$ layer structure, then, after formation of said third layer, introducing evaporated Zr source material into the reaction chamber via a fourth feed line to produce a fourth layer which is one of Zr and $ZrO_2$ layers having a thickness on said third layer, then, after formation of said fourth layer, introducing evaporated Pb source material into the reaction chamber via a fifth feed line to produce a fifth layer which is one of Pb and PbO layers having a thickness on said fourth layer, so as to produce a PZT layer structure having said third, fourth and fifth layers, all feed lines being separate from each to avoid mixing or reaction of the evaporated source material prior to introduction to the reaction chamber; and (d) repeating the sequence of the step (c) a number of times until the PZT ferroelectric thin film having a plurality of said PZT layer structures piled on the $PbTiO_3$ layer structure is formed.

203. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a $PbTiO_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a $PbTiO_3$ layer structure having the first and second layers;

(c) producing a PZT layer structure having a stoichiometric composition given as $(Pb)(Zr_xTi_{1-x})O_3$ where 0<x<1 by introducing evaporated Zr source material into the reaction chamber via a third feed line to produce a third layer which is one of the Zr and $ZrO_2$ layers having a thickness on said $PbTiO_3$ layer structure, then, after formation of said third layer, introducing evaporated Ti source material into the reaction chamber via a fourth feed line to produce a fourth layer which is one of Ti and $TiO_2$ layers having a thickness on said third layer, then, after formation of said fourth layer, introducing evaporated Pb source material into the reaction chamber via a fifth feed line to produce a fifth layer which is one of Pb and PbO layers having a thickness on said fourth layer, so as to produce a PZT layer structure having said third, fourth and fifth layers, all feed lines being separate from each to avoid mixing or reaction of the evaporated source material prior to introduction to the reaction chamber; and (d) repeating the sequence of the step (c) a number of times until the PZT ferroelectric thin film having a plurality of said PZT layer structures piled on the $PbTiO_3$ layer structure is formed.

204. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a $PbTiO_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a $PbTiO_3$ layer structure having the first and second layers;

(c) producing a PLZT layer structure having a stoichiometric composition given as $(Pb_{y-1}La_y)(Zr_xTi_{1-x})_{1-y/4}O_3$ where $0<x<1$ and $0<y<1$ by introducing evaporated Ti source material into the reaction chamber via a third feed line to produce a third layer which is one of the Ti and $TiO_2$ layers having a thickness on said $PbTiO_3$ layer structure, then, after formation of said third layer, introducing evaporated Pb source material into the reaction chamber via a fourth feed line to produce a fourth layer which is one of Pb and PbO layers having a thickness on said third layer, then, after formation of said fourth layer, introducing evaporated La source material into the reaction chamber via a fifth feed line to produce a fifth layer which is one of La and $La_2O_3$ layers having a thickness on said fourth layer, then, after formation of said third layer, introducing evaporated Zr source material into the reaction chamber via a sixth feed line to produce a sixth layer which is one of Zr and $ZrO_2$ layers having a thickness on said fifth layer, then, after formation of said sixth layer, introducing evaporated Pb source material into the reaction chamber via a seventh feed line to produce a seventh layer which is one of Pb and PbO layers having a thickness or said sixth layer, and, after formation of said seventh layer, introducing evaporated La source material into the reaction chamber via an eighth feed line to produce an eighth layer which is one of La and $La_2O_3$ layers having a thickness on said seventh layer so as to produce a PLZT layer structure having said third, fourth, fifth, sixth, seventh and eighth layers, all feed lines being separate from each to avoid mixing or reaction of the evaporated source material prior to introduction to the reaction chamber; and (d) repeating the sequence of the step (c) a number of times until the PLZT ferroelectric thin film having a plurality of said PZT layer structures piled on the $PbTiO_3$ layer structure is formed.

205. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a $PbTiO_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a $PbTiO_3$ layer structure having the first and second layers;

(c) producing a PLZT layer structure having a stoichiometric composition given as $(Pb_{1-y}La_y)(Zr_xTi_{1-x})_{1-y/4}O_3$ where $0<x<1$ and $0<y<1$ by introducing evaporated Ti source material into the reaction chamber via a third feed line to produce a third layer which is one of the Ti and $TiO_2$ layers having a thickness on said of $PbTiO_3$ layer structure, then, after formation of said third layer, introducing evaporated La source material into the reaction chamber via a fourth feed line to produce a fourth layer which is one of La and $La_2O_3$ layers having a thickness on said third layer, then, after formation of said fourth layer, introducing evaporated Pb source material into the reaction chamber via a fifth feed line to produce a fifth layer which is one of Pb and PbO layers having a thickness on said fourth layer, then, after formation of said fifth layer, introducing evaporated Zr source material into the reaction chamber via a sixth feed line to produce a sixth layer which is one of Zr and $ZrO_2$ layers having a thickness on said fifth layer, then, after formation of said sixth layer, introducing evaporated La source material into the reaction chamber via a seventh feed line to produce a seventh layer which is one of La and $La_2O_3$ layers having a thickness or said sixth layer, and, after formation of said seventh layer, introducing evaporated Pb source material into the reaction chamber via an eighth feed line to produce an eighth layer which is one of Pb and PbO layers having a thickness on said seventh layer so as to produce a PLZT layer structure having said third, fourth, fifth, sixth, seventh and eighth layers, all feed lines being separate from each to avoid mixing or reaction of the evaporated source material prior to introduction to the reaction chamber; and (d) repeating the sequence of the step (c) a number of times until the PLZT ferroelectric thin film having a plurality of said PLZT layer structures piled on the $PbTiO_3$ layer structure is formed.

206. A method of producing a ferroelectric thin film on a substrate placed in a reaction chamber, comprising the steps of:

(a) heating the substrate and introducing $O_2$ and/or $O_3$ gases into the reaction chamber to provide an oxygen gas atmosphere therein;

(b) producing a $PbTiO_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Ti source material into the reaction chamber via a third feed line to produce a third layer which is one of the Ti and TiO$_2$ layers having a thickness on said of PbTiO$_3$ layer structure, then, after formation of said third layer, introducing evaporated Zr source material into the reaction chamber via a fourth feed line to produce a fourth layer which is one of Zr and ZrO$_2$ layers having a thickness on said third layer, then, after formation of said fourth layer, introducing evaporated Pb source material into the reaction chamber via a fifth feed line to produce a fifth layer which is one of Pb and PbO layers having a thickness on said fourth layer, then, after formation of said fifth layer, introducing evaporated La source material into the reaction chamber via a sixth feed line to produce a sixth layer which is one of La and La$_2$O$_3$ layers having a thickness on said fifth layer so as to produce a PLZT layer structure having said third, fourth, fifth and sixth layers, all feed lines being separate from each to avoid mixing or reaction of the evaporated source material prior to introduction to the reaction chamber; and (d) repeating the sequence of the step (c) a number of times until the PLZT ferroelectric thin film having a plurality of said PLZT layer structures piled on the PbTiO$_3$ layer structure is formed.

207. A method of producing a ferroelectric thin film on a substrate placed in a reaction chamber, comprising the steps of:

(a) heating the substrate and introducing O$_2$ and/or O$_3$ gases into the reaction chamber to provide an oxygen gas atmosphere therein;

(b) producing a PbTiO$_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Ti source material into the reaction chamber via a third feed line to produce a third layer which is one of the Ti and TiO$_2$ layers having a thickness on said PbTiO$_3$ layer structure, then, after formation of said third layer, introducing evaporated Zr source material into the reaction chamber via a fourth feed line to produce a fourth layer which is one of Zr and ZrO$_2$ layers having a thickness on said third layer, then, after formation of said fourth layer, introducing evaporated La source material into the reaction chamber via a fifth feed line to produce a fifth layer which is one of La and La$_2$O$_3$ layers having a thickness on said fourth layer, then, after formation of said fifth layer, introducing evaporated Pb source material into the reaction chamber via a sixth feed line to produce a sixth layer which is one of Pb and PbO layers having a thickness on said fifth layer so as to produce a PLZT layer structure having said third, fourth, fifth and sixth layers, all feed lines being separate from each to avoid mixing or reaction of the evaporated source material prior to introduction to the reaction chamber; and (d) repeating the sequence of the step (c) a number of times until the PLZT ferroelectric thin film having a plurality of said PLZT layer structures piled on the PbTiO$_3$ film is formed.

208. A method of producing a ferroelectric thin film on a substrate placed in a reaction chamber, comprising the steps of:

(a) heating the substrate and introducing O$_2$ and/or O$_3$ gases into the reaction chamber to provide an oxygen gas atmosphere therein;

(b) producing a PbTiO$_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) producing a PLZT layer structure having a stoichiometric composition given as (Pb$_{1-y}$La$_y$)(Zr$_x$Ti$_{1-x}$)$_{1-y/4}$O$_3$ where 0<x<1 and 0<y<1 by introducing evaporated Zr source material into the reaction chamber via a third feed line to produce a third layer which is one of the Zr and ZrO$_2$ layers having a thickness on said PbTiO$_3$ layer structure, then, after formation of said third layer, introducing evaporated Ti source material into the reaction chamber via a fourth feed line to produce a fourth layer which is one of Ti and TiO$_2$ layers having a thickness on said third layer, then, after formation of said fourth layer, introducing evaporated Pb source material into the reaction chamber via a fifth feed line to produce a fifth layer which is one of Pb and PbO layers having a thickness on said fourth layer, then, after formation of said fifth layer, introducing evaporated La source material into the reaction chamber via a sixth feed line to produce a sixth layer which is one of La and La$_2$O$_3$ layers having a thickness on said fifth layer so as to produce a PLZT layer structure having said third, fourth, fifth and sixth layers, all feed lines being separate from each to avoid mixing or reaction of the evaporated source material prior to introduction to the reaction chamber; and (d) repeating the sequence of the step (c) a number of times until the PLZT ferroelectric thin film having a plurality of said PLZT layer structures piled on the PbTiO$_3$ layer structure is formed.

209. A method of producing a ferroelectric thin film on a substrate placed in a reaction chamber, comprising the steps of:

(a) heating the substrate and introducing O$_2$ and/or O$_3$ gases into the reaction chamber to provide an oxygen gas atmosphere therein;

(b) producing a PbTiO$_3$ layer structure by introducing evaporated Ti source material into the reaction chamber via a first feed line to produce a first layer and, after formation of said first layer, then introducing evaporated Pb source material into the reaction chamber via a second feed line to produce a second layer on said first layer so as to produce a PbTiO$_3$ layer structure having the first and second layers;

(c) producing a PLZT layer structure having a stoichiometric composition given as (Pb$_{1-y}$La$_y$)(Zr$_x$Ti$_{1-x}$)$_{1-y/}$ $_4$O$_3$ where 0<x<1 and 0<y<1 by introducing evaporated Zr source material into the reaction chamber via a third feed line to produce a third layer which is one of the Zr and ZrO$_2$ layers having a thickness on said PbTiO$_3$ layer structure, then, after formation of said third layer, introducing evaporated Ti source material into the reaction chamber via a fourth feed line to produce a fourth layer which is one of Ti and TiO$_2$ layers having a thickness on said third layer, then, after formation of said fourth layer, introducing evaporated La source material into the reaction chamber via a fifth feed line to produce a fifth layer which is one of La and La$_2$O$_3$ layers having a thickness on said fourth layer, then, after formation of said fifth layer, introducing evaporated Pb source material into the reaction chamber via a sixth feed line to produce a sixth layer which is one of Pb and PbO layers having a thickness on said fifth layer so as to produce a PLZT layer structure having said third, fourth, fifth and sixth layers, all feed lines being separate from each to avoid mixing or reaction of the evaporated source material prior to introduction to the reaction chamber; and (d) repeating the sequence of the step (c) a number of times until the PLZT ferroelectric thin film having a plurality of said PLZT layer structures piled on the PbTiO$_3$ layer substrate is formed.

210. A method of producing a ferroelectric thin film on a substrate placed in a reaction chamber, comprising the steps of:

(a) introducing one of O$_2$ and O$_3$ gases into the reaction chamber to provide an oxygen gas atmosphere therein;

(b) first introducing evaporated Ti source material into the reaction chamber via a first feed line and then sequentially introducing Pb and Zr source materials into the reaction chamber via respective feed lines separate from each other and the first feed line in an order to produce at least one molecular layer deposited on the substrate, the molecular layer having a stoichiometric composition indicated by a molecular formula composed of at least elements Pb, Zr, Ti and O, and (c) continuously repeating the sequence of the step (b) a number of times until the ferroelectric thin film having a plurality of the molecular layers deposited on the substrate is formed.

211. The ferroelectric thin film producing method as claimed in claim 210, wherein the Pb source material is Pb(C$_2$H$_5$)$_4$, the Zr source material is Zr(t—OC$_4$H$_9$)$_4$, and the Ti source material is Ti(i—OC$_3$H$_7$)$_4$.

212. The ferroelectric thin film producing method as claimed in claim 210, wherein the substrate is maintained at a temperature ranging from 350° C. to 750° C. during the step (b).

213. The method of claim 210 further comprising the step of, during producing step (b), discharging one evaporated source material in the reaction chamber prior to introducing another evaporated source material.

* * * * *